United States Patent [19]
Mishima et al.

[11] Patent Number: 6,072,992
[45] Date of Patent: *Jun. 6, 2000

[54] HIGH-FREQUENCY DEVICE

[75] Inventors: Akira Mishima; Shigeharu Sumi, both of Gifu; Motoyoshi Kitagawa, Aichi, all of Japan

[73] Assignee: Matsushita Electric Industrial Co., Ltd., Osaka, Japan

[ * ] Notice: This patent is subject to a terminal disclaimer.

[21] Appl. No.: 08/894,762

[22] PCT Filed: Dec. 25, 1995

[86] PCT No.: PCT/JP95/02668

§ 371 Date: Jul. 17, 1998

§ 102(e) Date: Jul. 17, 1998

[87] PCT Pub. No.: WO97/23953

PCT Pub. Date: Jul. 3, 1997

[51] Int. Cl.[7] .................................. H03J 3/28; H03J 5/02; H03L 7/08; H04L 27/22
[52] U.S. Cl. ........................ 455/76; 455/260; 455/264; 455/265; 455/130; 375/376; 331/25
[58] Field of Search .............................. 455/76, 260, 264, 455/265, 313, 130; 375/376; 331/25

[56] References Cited

U.S. PATENT DOCUMENTS

| | | |
|---|---|---|
| 4,912,437 | 3/1990 | Kuokkanen . |
| 5,325,401 | 6/1994 | Halik et al. . |
| 5,335,365 | 8/1994 | Ballantyne et al. ................ 455/76 |
| 5,390,168 | 2/1995 | Vimpari ................ 370/343 |
| 5,423,076 | 6/1995 | Westergren et al. ................ 455/86 |
| 5,461,348 | 10/1995 | Heuberger et al. ................ 332/128 |

FOREIGN PATENT DOCUMENTS

| | | |
|---|---|---|
| 2071817 | 3/1992 | Canada . |
| 0133799 | 3/1985 | European Pat. Off. . |
| 0673115A1 | 9/1995 | European Pat. Off. . |
| 55-050724 | 4/1980 | Japan . |
| 57-089304 | 6/1982 | Japan . |
| 58-16260 | 4/1983 | Japan . |
| 60-33727 | 2/1985 | Japan . |
| 61-120528 | 6/1986 | Japan . |
| 64-25236 | 2/1989 | Japan . |
| 02-151101 | 6/1990 | Japan . |
| 4-70217 | 3/1992 | Japan . |
| 5-276208 | 10/1993 | Japan . |
| 7-245633 | 9/1995 | Japan . |
| 2282285 | 3/1995 | United Kingdom . |

*Primary Examiner*—William G. Trost
*Assistant Examiner*—Temica M. Davis
*Attorney, Agent, or Firm*—Ratner & Prestia

[57] ABSTRACT

A high frequency apparatus for receiving digital modulated high frequency signal which withstands vibration and is easy to adjust for tuning, yet presents clear oscillation signal. The invented apparatus has an input terminal(101), a mixer(104) which receives at one input the signals supplied to input terminal(101) and at the other input an output signal of local oscillator(103), and output terminals(107,108) to which the output signal of mixer(104) is delivered. A voltage controlled oscillator constituting said local oscillator(103) has an oscillating section and a tuning section; the tuning section has a movable conductive member(119) and a gluing agent (120) for maintaining a state after adjustment. Control loop has a high loop band width which is large enough so as the noise of local oscillator(103) is not dominated by noise of the above mentioned voltage controlled oscillator.

111 Claims, 27 Drawing Sheets

Fig. 2
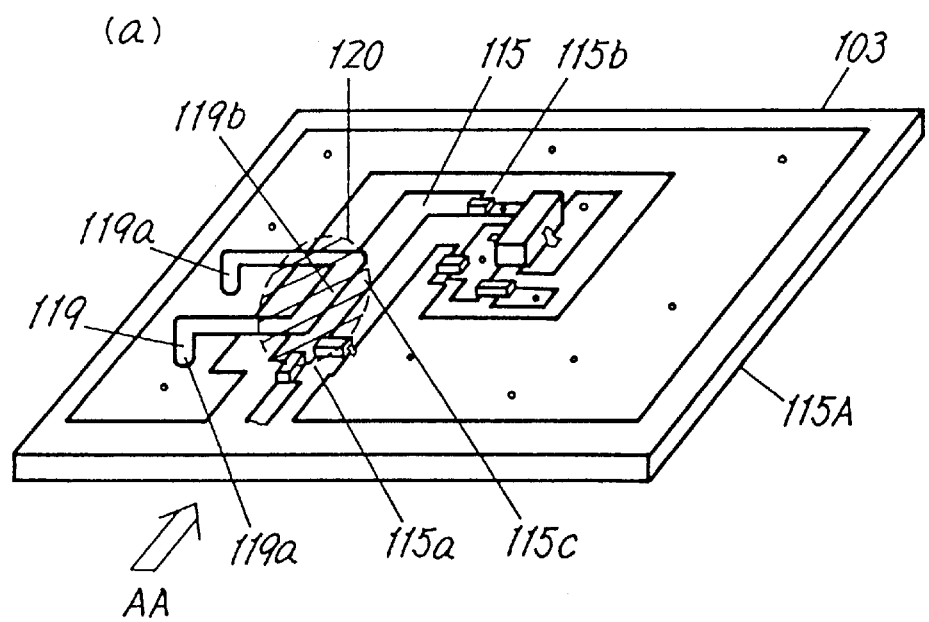
(a)
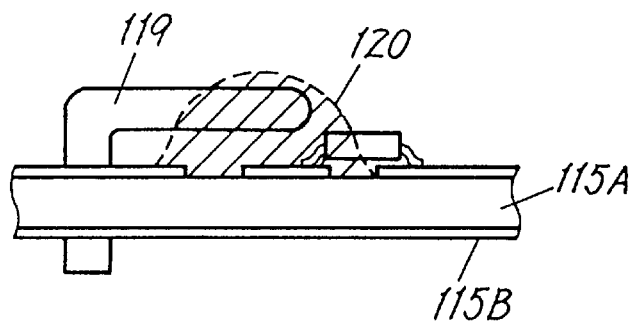
(b)

Fig. 5
(a)
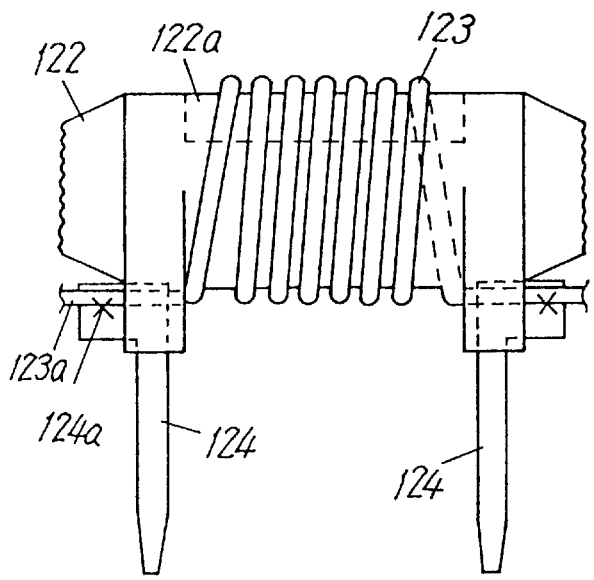
(b)
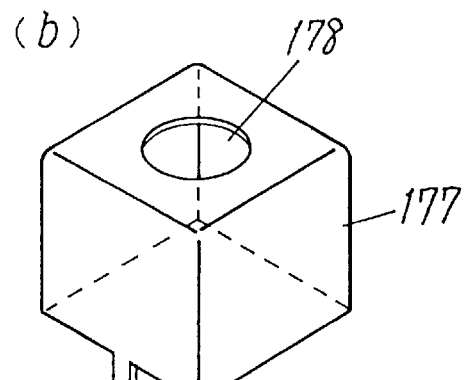
(c)
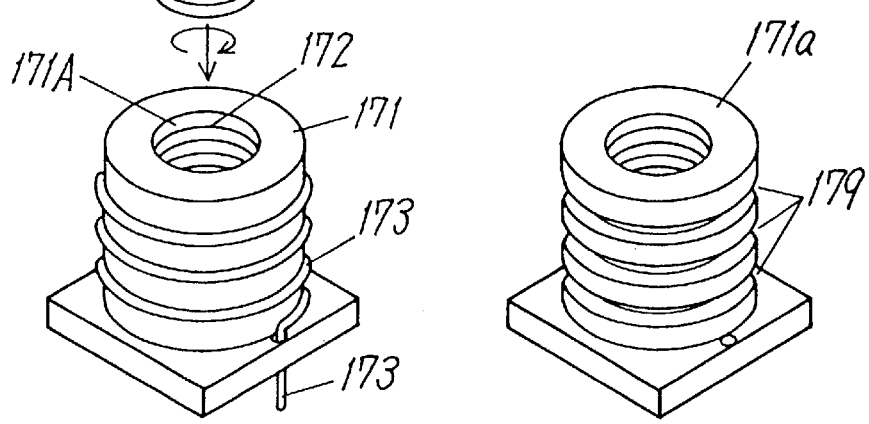

Fig. 7
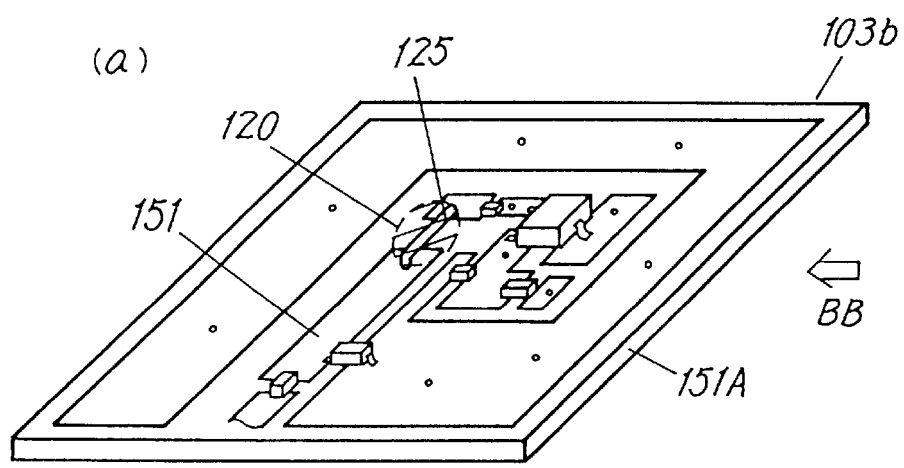
(a)
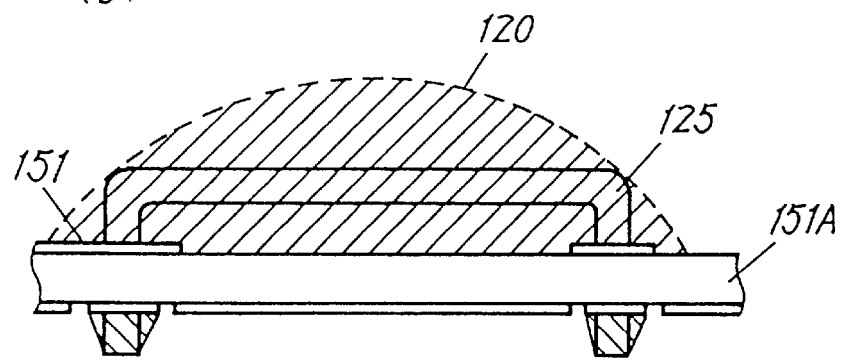
(b)
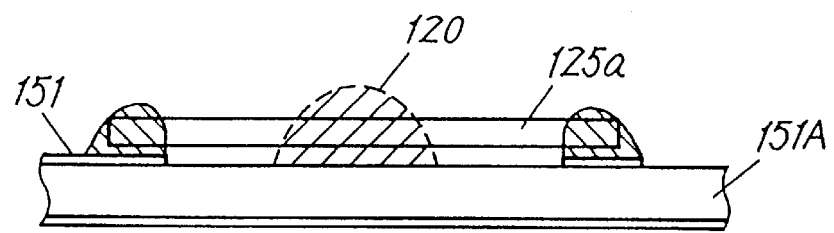
(c)

Fig. 9
(a)
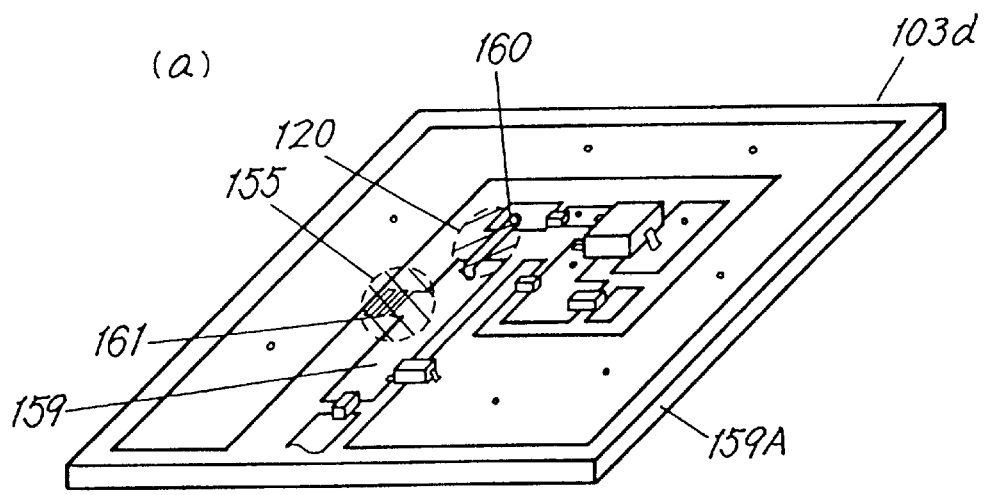
(b)
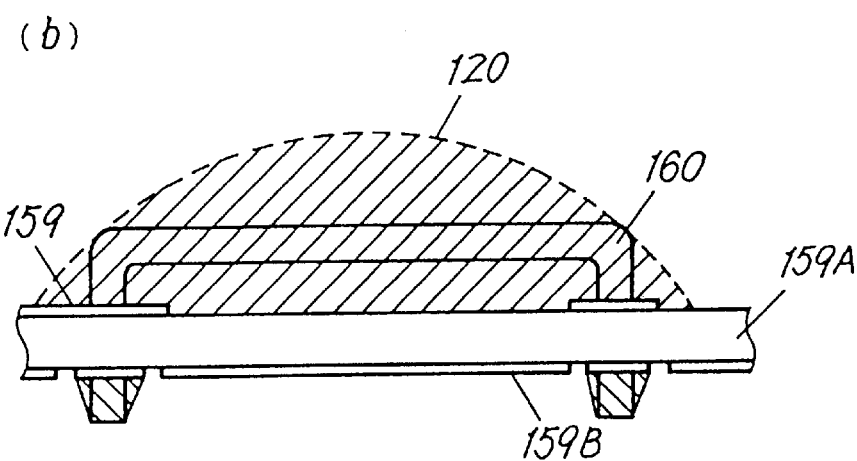
(c)
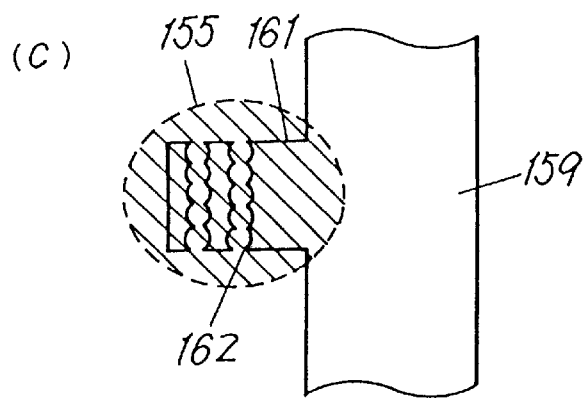

Fig. 12
(a)
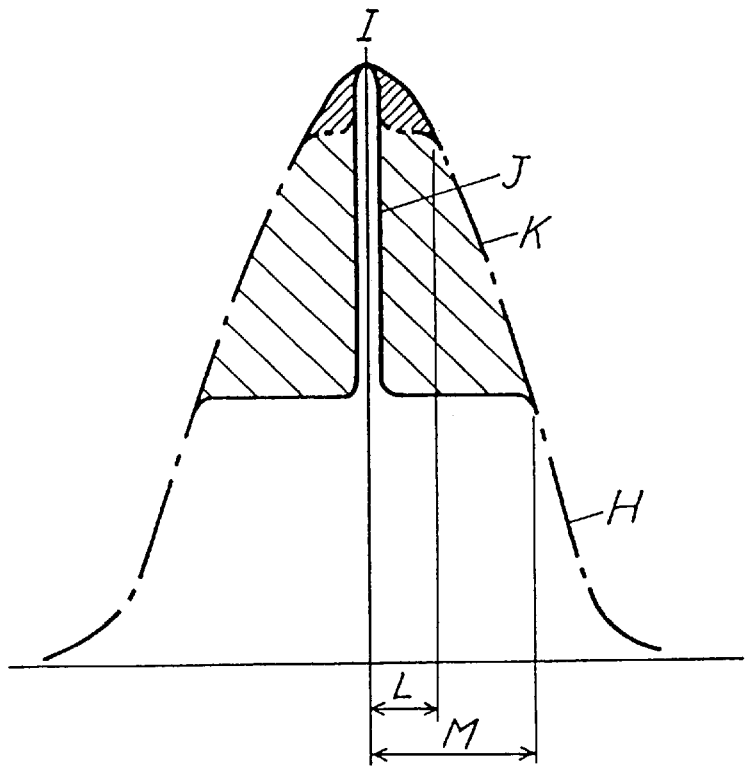
(b)
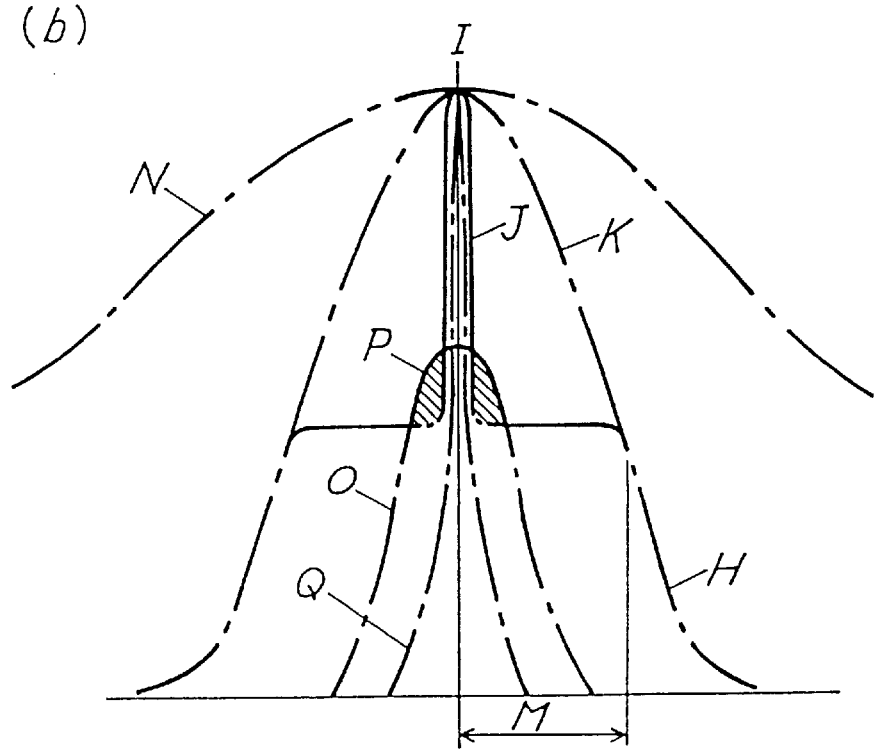

Fig. 16(a)
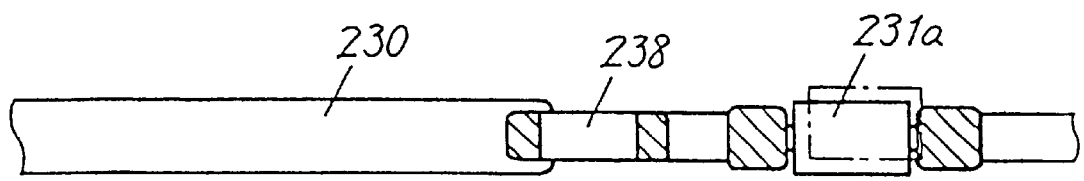
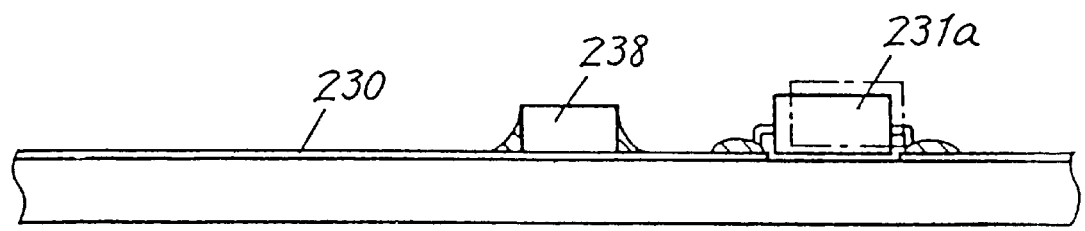
Fig. 16(b)

HIGH-FREQUENCY DEVICE

SPECIFICATION

This application is the U.S. national-phase application of PCT International Application No. PCT/JP95/02668.

TECHNICAL FIELD

The present invention relates to a high frequency apparatus for receiving digital modulated high frequency signals.

BACKGROUND ART

In the conventional high frequency apparatus, the inductance of tuning part of voltage controlled oscillator was formed with a strip type transmission line alone, for the sake of securing a high anti-vibration property.

Namely, if the inductance is formed with e.g. a coil component a vibration may cause vibration of wire of the coil, which invites a shift in the inductance value, resulting in a displacement of a tuned frequency. In order to avoid the occurrence of such phenomenon, the inductance was formed solely with a strip type transmission line.

A problem in the above described structure, where the inductance of tuning part is comprised of a strip type transmission line alone, is that fine tuning of tuning adjustment is not easy, because the dispersion due to component constant and mounting position of electronic components constituting local oscillator is compensated before completion.

DISCLOSURE OF THE INVENTION

The present invention is intended to present a high frequency apparatus having an inductance, with which the anti- vibration property is improved, the stability of oscillation frequency is assured for a long time, the tuning adjustment is easy, and a local oscillator supplies clearer output signal of less phase noise to a mixer.

For implementing the objective, an apparatus according to the present invention comprises an input terminal for receiving digital modulated high frequency signals, a mixer which receives the signals inputted to the input terminal at one input and an output signal of local oscillator at the other input, and an output terminal for delivering output signal of the mixer, said local oscillator being comprised of a voltage controlled oscillator, a frequency divider intervening in the control loop of the voltage controlled oscillator, a phase comparator and a loop filter. Said voltage controlled oscillator comprises an oscillation section and a tuning section. The tuning section comprises a frequency adjusting section and a means for maintaining a tuned state of the frequency adjusting section. Said control loop has a sufficiently high loop band width so as the noise of said local oscillator is not dominated by noise of said voltage controlled oscillator. Thus in an invented high frequency receiving apparatus the anti-vibration property is improved, the stability of oscillation frequency is ensured for a long term, the tuning adjustment is easy, and the local oscillator supplies clear output signals free from phase noise to the mixer.

An invented high frequency apparatus as recited in claim 1 comprises an input terminal for receiving digital modulated high frequency signals, a mixer for receiving the inputted signal at one input and output signal of local oscillator at the other input, and an output terminal for delivering output signal of the mixer; wherein, said local oscillator comprises a voltage controlled oscillator, a frequency divider intervening in the control loop of the voltage controlled oscillator, a phase comparator, and a loop filter. Said voltage controlled oscillator comprises an oscillation section and a tuning section. The tuning section comprises a frequency adjusting section and a means for maintaining a tuned state of the frequency adjusting section. Said control loop has a sufficiently high loop band width so as the noise of said local oscillator is not dominated by noise of said voltage controlled oscillator.

With the above described constitution, the tuning adjustment is easy because a frequency adjusting section has been provided as the tuning section of voltage controlled oscillator, furthermore the state of frequency adjusting section after adjustment is maintained by the maintaining means; the anti-vibration property etc, are therefore sufficiently assured.

Meanwhile, in a case when a maintaining means is used for assuring the anti-vibration property and the long term stability of oscillation frequency a stray capacitance is usually formed in the tuning section because the inductance intrinsic to the maintaining means is higher than that of the atmospheric air, as a result the dielectric loss is caused by the stray capacitance and the oscillation characteristics deteriorate. In the present invention, however, the control loop of voltage controlled oscillator has a sufficiently high loop band width so as the noise of local oscillator is not dominated by noise of voltage controlled; therefore, the deterioration of oscillation characteristics is compensated for a broad frequency width. Thus output signals to be delivered from local oscillator to mixer are clear that is free from phase noise.

An invented high frequency apparatus as recited in claim 2 is that of claim 1, wherein the frequency adjusting section in tuning section is comprised of a movable conductive member provided on substrate, which conductive member is fixed after adjustment with a fix member, or a maintaining means. When we say movable, we include all types of motion such as(but not limited to) pivotable, slidable, elongaged. As the movable conductive member is firmly fixed with a fix member, an adjusted value hardly shifts due to vibration or aging.

An invented high frequency apparatus as recited in claim 3 is that of of claim 1, wherein the inductance element of tuning section employs a pattern inductance line, a movable conductive member is placed in the vicinity of the pattern inductance line, and the movable conductive member is fixed with a fix member, or a maintaining means, after a tuning frequency is adjusted by moving the movable conductive member. With the above constitution, the component counts and process step counts may be reduced by putting putting some part of the inductance into a pattern; in the meantime, as the tuning section of local oscillator is adjustable by the movable conductive member the input signals may be received over the entire range even if there are dispersions in the value of components constituting the voltage controlled oscillator and the mounting position of the components. Furthermore, because the movable conductive member is fixed with a fix member, or a maintaining means, after adjustment a tuned frequency is maintained stable and the inductance value does not shift due to deformation to be caused by long term temperature cycles etc.

An invented high frequency apparatus as recited in claim 4 is that of claim 3, wherein the movable conductive member is disposed above approximately the center of width and in approximately parallel with pattern inductance line. With the above described constitution, a finer adjusting is easy because of the small coupling and the narrow adjustable range.

An invented high frequency apparatus as recited in claim 5 is that of claim 3, wherein the movable conductive member is disposed in the neighborhood of an opening end of pattern inductance line. With the above constitution, because of greatly changing degree of coupling a relatively large adjustable range is obtainable for the oscillation frequency.

An invented high frequency apparatus as recited in claim 6 is that of claim 1, wherein the inductance element of tuning section is comprised of a coreless coil or a flat line, the inductance is adjusted by adjusting the coreless coil or the flat line, and then a state after the adjusting is fixed with a fix member, or a maintaining means. With the above constitution, because of the use of coreless coil or flat line, it is easy to have large inductance, and a compact and relatively low-frequency voltage controlled oscillator is obtainable.

An invented high frequency apparatus as recited in claim 7 is that of of claim 1, wherein a conductor as the coil is wound around the outer surface of a core used as the maintaining means. With the above constitution, the inductance value hardly shifts due to coil deformation even if an external force is exerted on the coil, because an electroconductive member, or a coil, is wound around a core.

An invented inductance element constituting the tuning section as recited in claim 8 is the high frequency apparatus of claim 1 comprising a cylinder shaped insulator, a conductor wound around the outer surface of the insulator, a female screw provided inside the cylinder shaped insulator, and a movable core having a male screw that couples with the female screw around the outer surface. With the above constitution, as the inductance value can be modified by revolving the movable core the automatic adjusting can easily be introduced. Further, even if an external force is exerted the inductance value hardly shifts due to coil deformation, because the conductor is wound around an insulator. Furthermore, the movable core is fixed to the insulator by friction of screw not allowing the movable core to shift from an adjusted position; therefore, the inductance value is kept unchanged for a long term.

An invented high frequency apparatus as recited in claim 9 is that of claim 1, wherein a pattern inductance line and a movable conductive member are connected in series to form an inductance element constituting the tuning section, the inductance value is adjusted by adjusting the movable conductive member, and the movable conductive member is fixed after the adjustment with a fix member, or a maintaining means. With the above constitution, the area of substrate may be reduced because the inductance is shared in common by the pattern inductance line and the serial movable conductive member. Which contributes to make an apparatus compact.

An invented high frequency apparatus as recited in claim 10 is that of claim 1, wherein a pattern inductance line is used as the inductance element constituting the tuning section, an adjustment is conducted by trimming an adjusting section provided on the pattern inductance line, and the trimmed portion is covered by a covering material. With this constitution, the adjusting is performed by a two-dimensional work of trimming on the pattern inductance line, therefore the automatic adjusting can easily be implemented. Further, because the trimmed portion is covered with a covering material for preventing chemical reaction to be caused by absorption of humidity, oxidation, etc., an adjusted value is maintained for a long term.

An invented high frequency apparatus as recited in claim 11 is that of claim 10, wherein a movable conductive member is connected in series with the pattern inductance line, and the movable conductive member is fixed after adjustment by a fix member, or a maintaining means. With the above constitution, the adjustment may be conducted easily with high accuracy, because there are two frequency adjusting sections provided, viz. the trimming of the pattern inductance line and the adjustment of movable conductive member.

An invented high frequency apparatus as recited in claim 12 is that of claim 1, wherein the local oscillator and the mixer are housed in a metal case, and the pattern inductance line laid on a substrate constituting a part of the tuning section of said local oscillator is disposed in the vicinity of metal case or separating plate. With the above constitution, a stable oscillation frequency is obtainable because a metal case or separating plate provided with a stable potential by grounding etc. is disposed in the vicinity of pattern inductance line for avoiding the influence of outside signals.

An invented high frequency apparatus as recited in claim 13 is that of claim 1, wherein a film capacitor is used as the capacitance of loop filter. With the above constitution, the capacitance shift due to piezoelectric effect caused by a pressure to be exerted on a capacitor as a result of vibration given on the film capacitor is reduced. This makes it possible to implement a high performance voltage controlled oscillator that is stable against vibration.

An invented high frequency apparatus as recited in claim 14 is that of claim 13, wherein a film capacitor is mounted on the upper surface of substrate, lead wire of the capacitor is inserted in a through hole provided in said substrate to be soldered with a conductive pattern in the back surface, and the inside of said through hole being non-electrode-forming section. With the above constitution, the film capacitor will never be broken by the solder melting heat even when a soldered lead wire is soldered at the back surface of substrate; because no electrode is formed in the through hole the lead wire is passing, a non-heating length is secured for more than the substrate thickness. The non-heating length prevents a molten solder from reaching at the root of lead wire of film capacitor.

An invented high frequency apparatus as recited in claim 15 is that of claim 13, wherein the loop filter is separated from the voltage controlled oscillator by a separating plate, the separating plate being provided with an opening to allow a conductive pattern connecting between said loop filter and said voltage controlled oscillator going through, and a film capacitor is mounted at the vicinity of and covering the opening. With the above constitution, as one electrode of film capacitor being stably grounded and the opening is shielded by the film capacitor, the loop filter and the voltage controlled oscillator are electrically separated to each other enabling efficient layouting of components.

An invented loop filter as recited in claim 16 is the high frequency apparatus of claim 1, wherein a loop filter is comprised of transistors in two stages. The two-staged transistors provide an appropriate amplitude at an inexpensive cost, thus a loop filter may be wide-banded.

An invented high frequency apparatus as recited in claim 17 is that of claim 1, wherein a movable conductive member constituting the tuning section, a varactor diode and a pattern inductance line are serially connected in the order, said pattern inductance line being connected with the oscillating section. With the above constitution, because the oscillating section is coupled with a pattern inductance line having a fixed inductance the instable coupling due to high frequency mode never arises, and because the adjustment is conducted by a movable conductive member disposed most remote from the oscillating section the adjusting is easy. As the varactor diode is disposed between movable conductive member and pattern inductance line an appropriate range of oscillation frequency is obtained by the varactor diode and the movable conductive member; further, as it is not needed to raise the tuning sensitivity higher than a certain level an increase of phase noise is suppressed even if a noise is jumping into the loop filter.

An invented high frequency apparatus as recited in claim 18 is that of claim 1, wherein a chip capacitor of small capacitance is mounted between the serial connection of varactor diode and pattern inductance line in proximity to said pattern inductance line, the varactor diode and the pattern inductance line is constituting the tuning section. The mounting of small capacitance chip capacitor raises the impedance of line. The impedance raised due to the chip capacitor contributes to diminish the influence to be caused by soldering which might eventually change the length of lead wire of varactor diode. Namely, as the varactor diode is heavier than the chip capacitor the self alignment effect does not work in reflow soldering, the accuracy of positioning on substrate is deteriorated and the substantial length including lead wire etc. is dispersed, causing non-uniform impedance. On the other hand, as the chip capacitor is light in weight the self alignment effect works during reflow soldering to a stable positioning. Although there is a possibility for the inductance between chip capacitor and varactor diode to disperse, dispersion of oscillation frequency of the voltage controlled oscillator is small because the impedance has already been raised by a chip capacitor.

An invented high frequency apparatus as recited in claim 19 is that of claim 18, wherein a first small capacitance chip capacitor is inserted between the inductance and the varactor diode constituting tuning section, a second capacitor is inserted between said varactor diode and the oscillation section, said first capacitor and said second capacitor being temperature compensation capacitors. With the above constitution, the combination of respective temperature compensation characteristics of the two capacitors, first and second capacitors, provides a better temperature compensation characteristic; which implements a voltage controlled oscillator stable against temperature shift.

An invented high frequency apparatus as recited in claim 20 is that of claim 1 further comprising a reference frequency divider to which reference frequency signal is inputted, the reference frequency divider having a variable dividing ratio. With the above constitution, as there is a reference frequency divider to which reference frequency signal is inputted and the dividing ratio is variable the dividing ratio of frequency divider of control loop may be made smaller maintaining the high loop band width, the response speed may be made faster, and a desired tuning frequency range is obtained.

An invented reference divider as recited in claim 21 is the high frequency apparatus of claim 20, wherein the dividing ratio of reference frequency divider goes smaller along with the increasing frequency of output from voltage controlled oscillator. With the above constitution, as the dividing ratio of reference frequency divider and the dividing ratio of frequency divider in control loop are controlled together in accordance with the output frequency of voltage controlled oscillator the dividing ratio of frequency divider may be made smaller without being controlled by the output frequency; the response is thus improved.

An invented high frequency apparatus as recited in claim 22 is that of claim 1, wherein a plurality of intermediate frequency tuning filters each having a roll-off characteristic and different band width are provided in parallel between mixer and output terminal, the intermediate frequency tuning filters being selectively switched according to the transfer rate of signal to be inputted from the input terminal. With the above constitution, as the intermediate frequency tuning roll-off filters are selectively switched according to the difference in the band width of high frequency signal to be inputted from the input terminal, signals may be received in best condition even if their transfer rate is different, moreover the circuits before mixer may be shared in common.

An invented high frequency apparatus as recited in claim 23 is that of claim 1, wherein a variable attenuator is provided between the input terminal and the mixer, the variable attenuator having been provided with a control terminal for controlling the variable attenuator. With the above constitution, as the quantity of attenuation is controllable by a signal from the control terminal an optimal control is conducted for not inviting a mixed modulation at the mixer.

An invented high frequency apparatus as recited in claim 24 is that of claim 1, wherein an I/Q detector is connected to the output terminal via an intermediate frequency tuning surface acoustic wave filter, a first output terminal is provided for outputting I signal of the I/Q detector, a second output terminal is provided for outputting Q signal of said I/Q detector, a second oscillator is provided for supplying oscillation frequency signal to said I/Q detector, substrate of a surface acoustic wave resonator constituting the resonating section of said second oscillator and substrate of said intermediate frequency tuning surface acoustic wave filter being made of a same material, a frequency error sensor is provided for the signals to be delivered from said first output terminal and said second output terminal, data of frequency divider are controlled at an adding/subtracting counter based on the output from error sensor, and the centre of intermediate frequency being made almost identical to oscillation frequency of said second oscillator.

With the above constitution, as the substrate of surface acoustic wave resonator of second oscillator and the substrate of intermediate frequency tuning surface acoustic wave filter are made of a same material, even if the frequency of intermediate frequency tuning surface acoustic wave filter is shifted due to temperature change etc. the frequency of second oscillator also shifts in the same direction for the same frequency; therefore, the shift is set-off as a whole, resulting in a state as if there were no shift taken place.

Further, by controlling the frequency control data at adding/subtracting counter according to the frequency error sensor so as the center frequency of intermediate frequency, being output from mixer, is to be equal to the oscillation frequency of second oscillator the center frequency of intermediate frequency becomes almost identical to the center frequency of intermediate frequency tuning surface acoustic wave filter. The detection error is thus eliminated, and an inexpensive material is usable for the substrate; which helps reduce the apparatus cost.

An invented high frequency apparatus as recited in claim 25 is that of claim 24, wherein a band width of 3 dB cutoff frequency in intermediate frequency tuning surface acoustic wave filter is more than 0% within +5% of the band width equal to the symbol rate of receiving signal. Such a characteristic also functions to restore a characteristic emphasized at transmitting side to the original state. Therefore, there is no need of providing any specific filter for restoring a characteristic emphasized at transmitting to the original state.

An invented high frequency apparatus as recited in claim 26 is that of claim 1, wherein an input filter is inserted between input terminal and mixer, local oscillator oscillates a frequency that yields an intermediate frequency greater than one half the difference between the largest frequency and the smallest frequency to be inputted to said input terminal, said input filter being a fixed filter which allows all the frequencies ranging from said smallest frequency to largest frequency to pass through. With the above constitution, an image affecting frequency is always higher than the highest receiving frequency, as the local oscillator is made to oscillate a frequency that yields an intermediate frequency greater than one half the difference between the largest frequency and the smallest frequency to be inputted. This makes it possible to connect to the input terminal a fixed filter which allows the frequency from the smallest receiving frequency to the largest receiving frequency to pass. Therefore, despite the use of a fixed filter, which is inexpensive, disturbance on image is prevented, and the structure of an apparatus is significantly simplified.

An invented high frequency apparatus as recited in claim 27 is that of claim 26, wherein the frequency of output signal from mixer is made to be approximately 612 MHz. With the above constitution, no disturbance comes from the input terminal, as the intermediate frequency is set at an empty channel frequency of receiving signal. Further, an approximately 612 MHz trap may be inserted next to the input terminal.

An invented high frequency apparatus as recited in claim 28 is that of claim 1, wherein an I/Q extracting means is connected to output terminal, a first output terminal coupled with I signal output of the I/Q extracting means is provided, a second output terminal coupled with Q signal output of said I/Q extracting means is provided, a demodulator is connected with said first and second output terminal, which demodulator being mounted outside of metal cover. With the above constitution, a good heat dissipation is assured because an integrated circuit section of the demodulator is not surrounded by a cover. Therefore, there is no risk of operating error due to thermal runaway etc. of integrated circuit. Further, as a sufficient thermal dissipation is assured the integration density of integrated circuit may be raised for making the device smaller. This helps making a high frequency apparatus smaller.

An invented high frequency apparatus as recited in claim 29 is that of claim 28, wherein a substrate having a demodulator comprised of integrated circuits mounted on the surface, a copper foil laid underneath said demodulator and a copper foil provided on the back surface of said substrate are connected with a through hole. With the above constitution, as the copper foil underneath integrated circuits and the copper foil on the back surface of substrate are connected together by through hole a heat generated by the integrated circuits is conducted via through hole to the copper foil on the back surface for dissipation.

An invented high frequency apparatus as recited in claim 30 is that of claim 28, wherein a hole is provided in the substrate carrying a demodulator comprised of integrated circuits at a place beneath said integrated circuits, the size of which hole being larger than chip size inside the integrated circuit device and smaller than the outer dimension of integrated circuit device. With the above constitution, as the hole is smaller than the outer dimension of integrated circuit device the device can be easily mounted by an ordinary chip mounting machine. Furthermore, the heat is dissipated efficiently because both the upper and the bottom surfaces of the device are exposed direct to the air.

An invented high frequency apparatus as recited in claim 31 is that of claim 29, wherein a plurality of strips void of solder resist are provided on the copper foil on the back surface of substrate, and solder is melted with protrusion on the strips void of solder resist. With the above constitution, as the back surface copper foil is provided with protruding solders the area contacting to the air has been expanded for more efficient heat dissipation.

An invented high frequency apparatus as recited in claim 32 is that of claim 1, wherein a filter is provided between input terminal and mixer, an intermediate frequency tuning filter is connected with the output terminal, an I/Q extracting means is provided with which the output from intermediate frequency tuning filter is connected, a first output terminal connected with the I signal output of I/Q extracting means is provided, a second output terminal connected with the Q signal output of said I/Q extracting means is provided, all these being housed in a shield case. With the above constitution, the shield case avoids disturbances from outside, for example by a digital clock etc., comming inside the high frequency apparatus for a broad range of frequency.

An invented high frequency apparatus as recited in claim 33 is that of claim 32, wherein at least one sheet of shield plate is provided between the mixer and an oscillator to be used for the I/Q extracting means. The above constitution helps reducing the spurious due to interference of said oscillator to mixer.

An invented high frequency apparatus as recited in claim 34 is that of claim 32, wherein the mixer and an oscillator to be used for the I/Q extracting means are disposed on a diagonal line in a shield case. The above constitution likewise helps reducing the spurious due to interference of said oscillator to mixer.

An invented high frequency apparatus as recited in claim 35 is that of claim 32, wherein an input terminal is provided in a width side of approximately rectangular shaped shield case, an input filter and said mixer are disposed in the order following the input terminal, and a local oscillator for supplying oscillation frequency to said mixer is provided approximately in pallarel with said input filter and said mixer with a separating plate in between. With the above constitution, as an input of digital signal for selecting a channel is located at the vicinity of input terminal of shield case in width side the digital signal for channel selection does not ill-affect other compartments.

An invented high frequency apparatus as recited in claim 36 is that of claim 33, wherein a compartment for mounting an intermediate frequency tuning filter is provided between the local oscillator for supplying oscillation frequency to mixer and the I/Q extracting means. With the above constitution, as the mixer and the I/Q detector are disposed separate to each other an excellent I/Q detection is performed without having mutual interference.

An invented high frequency apparatus as recited in claim 37 is that of claim 35, wherein a control terminal for local oscillator and an output termianl of I/Q extracting means are provided in the vicinity of first lengthside board of shield case. The above constitution offers a convenience of wiring, as each of the signals is disposed in a same direction in the substrate side.

An invention as recited in claim 38 is a high frequency apparatus which comprises an input terminal for receiving digital modulated high frequency signals, a mixer which receives the signals inputted to the input terminal at one of the inputs and output signals from local oscillator at the other input, and an output terminal which delivers output signals of the mixer, said local oscillator being comprised of a voltage controlled oscillator, a frequency divider intervening in the control loop of voltage controlled oscillator, a phase comparator and a loop filter. Said voltage controlled oscillator comprises an oscillating section and a tuning section, the tuning section being comprised of a frequency adjusting section and a maintaining means for maintaining an adjusted state of the frequency adjusting section. Said control loop being made to have a sufficiently great high loop band width so as the noise of said local oscillator is not affected by the noise of said voltage controlled oscillator, and a reference frequency signal to be delivered to said phase comparator being set to have a smaller signal level relative to a comparative signal delivered from frequency divider to comparator, in a same frequency with the exception of a portion substantially the center of frequency.

With the above constitution, the tuning adjustment is easy as there is a frequency adjusting section provided as tuning section of voltage controlled oscillator; further, as an adjusted state of the frequency adjusting section is maintained by a maintaining means the anti-vibration property is sufficiently assured.

On the other hand, when a maintaining means is employed for securing anti-vibration property a stray capacitance is formed because the material of maintaining means usually has an dielectric constant greater than the atmospheric air. This creates an dielectric loss, resulting in a deteriorated oscillation characteristic. In the present invention, however, the control loop of voltage controlled oscillator is set to have a high loop band width great enough so as the noise of local oscillator is not affected by the noise of voltage controlled oscillator, and the signal level of the reference frequency signal to be delivered to phase comparator is made to be smaller, relative to comparative signal delivered from frequency divider to comparator, in a same frequency with the exception of a portion substantially the center of frequency. As a result, the deterioration of oscillation characteristic is corrected over a broad frequency band width, therefore the output signal of local oscillator to be delivered to mixer is clearer having less phase noise.

An invented high frequency apparatus as recited in claim 75 comprises an input terminal for receiving digital modulated high frequency signals, a mixer which receives the signal inputted to the input terminal at one input and the output signal of local oscillator at the other input, and an output terminal to which the output signal of mixer is delivered, said local oscillator being comprised of a voltage controlled oscillator, a frequency divider intervening in the control loop of voltage controlled oscillator, a phase comparator and a loop filter. Said voltage controlled oscillator comprises an oscillating section and a tuning section, the tuning section being comprised of a frequency adjusting section and maintaining means for maintaining an adjusted state of the frequency adjusting section. Said control loop has a high loop band width great enough so as the noise of said local oscillator is not affected by noise of said voltage control oscillator, and the signal level at the vicinity of center frequency of reference frequency signal to be delivered to said phase comparator is made to be lower, relative to the frequency distribution characteristic of signal level at the vicinity of center frequency of said local oscillator to be delivered to mixer, than the signal level, which is to be noise-reduced by the high loop band width, in the same off-set frequency from the center frequency with the exception of a portion substantially the center of frequency in the frequency distribution characteristic.

With the above constitution, as there is a frequency adjusting section provided as tuning section of voltage controlled oscillator the tuning adjustment is easy, and as an adjusted state of the frequency adjusting section is maintained by a maintaining means the anti-vibration property is sufficiently assured. On the other hand, when a maintaining means is employed for the anti-vibration property the oscillation characteristic deteriorates, because the rate of inductance is generally higher with material of maintaining means than with the atmospheric air, which creates a stray capacitance.

In the present invention, however, the control loop of voltage controlled oscillator is made to have a high loop band width great enough so as the noise of local oscillator is not affected by noise of voltage controlled oscillator, and the signal level of reference frequency signal to be supplied to phase comparator is made to be lower, relative to the frequency distribution characteristic of signal level to be delivered from local oscillator to mixer, than signal level which is to be noise-reduced by the high loop band width, in a same off-set frequency from the center frequency with the exception of a portion substantially the center of frequency in the frequency distribution characteristic. As a result, the noise of reference frequency signal does not affect the noise reduction effect of local oscillator due to the high loop band width; in practice, the correction is conducted effectively for the high loop band width covering a broad frequency width. Therefore, a local oscillator is implemented economically, and the output signal becomes clear with reduced phase noise.

BRIEF DESCRIPTION OF THE DRAWINGS

FIG. 2(a) is a perspective view of a local oscillator in the high frequency apparatus of FIG. 1.

FIG. 2(b) is a side view showing a key part of FIG. 2(a).

FIG. 5(a) is a front elevation of a first exemplary inductance to be used as the tuning section of local oscillator in the high frequency apparatus of FIG. 4.

FIG. 5(b) is a perspective view showing assembly of a second exemplary inductance to be used as the tuning section of local oscillator in the high frequency apparatus of FIG. 4.

FIG. 5(c) is a perspective view of a third exemplary inductance.

FIG. 7(a) is a perspective view of local oscillator in the high frequency apparatus of FIG. 6.

FIG. 7(b) is a side view showing adjusting section of the local oscillator of FIG. 7(a).

FIG. 7(c) is a side view of a second exemplary adjusting section.

FIG. 9(a) is a perspective view of local oscillator according to Embodiment 5 of the present invention.

FIG. 9(b) is a side view showing movable conductive member of the local oscillator of FIG. 9(a).

FIG. 9(c) is a plane view showing adjusting section formed in the pattern inductance of the local oscillator.

FIG. 12(a) is a second frequency characteristics chart for explaining characteristics of local oscillator of the high frequency apparatus of FIG. 10.

FIG. 12(b) is a third frequency characteristics chart for explaining charatacteristics of local oscillator of the high frequency apparatus.

FIG. 16(a) is a plane view showing key part of voltage controlled oscillator in the high frequency apparatus of FIG. 10.

FIG. 16(b) is a side view of voltage controlled oscillator of the high frequency apparatus.

BEST MODE FOR CARRYING OUT THE INVENTION

Embodiment 1

Figure 1:
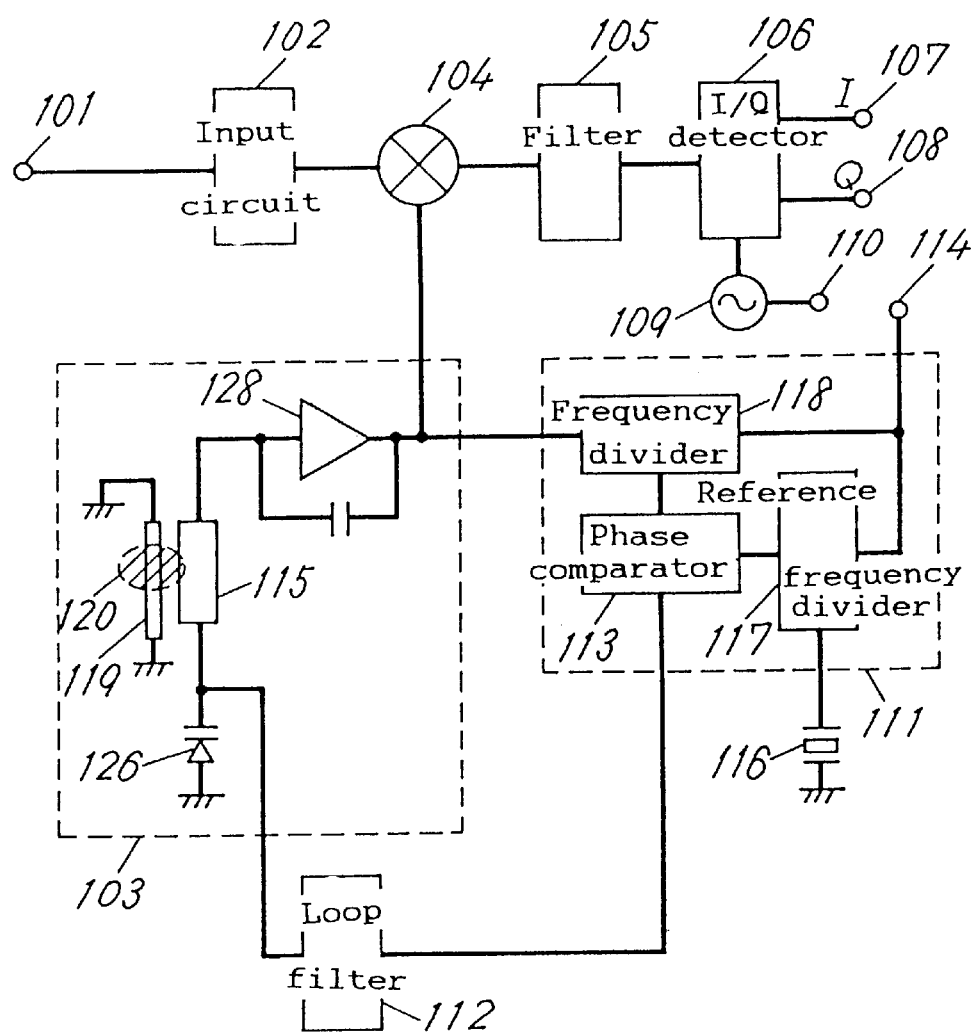
FIG. 1 is a block diagram showing high frequency apparatus according to Embodiment 1 of the present invention.

Referring to FIG. 1, a high frequency apparatus according to a first embodiment of the present invention comprises an input terminal 101 for receiving high frequency digital signals, an input circuit 102 connected to the input terminal 101, a mixer 104 to which an output of the input circuit 102 is supplied at one input, an output of a first oscillator 103, or a local oscillator, at the other input, a filter 105 connected to output of mixer 104, an I/Q detector 106 connected to output of filter 105, a first output terminal 107 for outputting I signal of the I/Q detector 106, a second output terminal 108 for outputting Q signal of said I/Q detector, a second oscillator 109 for supplying oscillation frequency signal to said I/Q detector 106, an AFC terminal 110 for controlling oscillation frequency of the second oscillator 109, a PLL (frequency divider and phase comparator) 111 to which an output of said first oscillator 103 is connected, and a loop filter (hereinafter referred to as low pass filter) 112 connected between the PLL 111 and input of said first oscillator 103.

In the first oscillator 103, output of low-pass filter 112 is delivered to input of an amplifier 128, which constitutes an oscillator, via a strip type transmission line(an example of the pattern inductance line) 115 laid on a substrate 115A, and a connecting point of low pass filter 112 and strip type transmission line 115 is grounded via a variable capacitance diode 126. The output of amplifier 128 being output of the first oscillator 103. A grounding pattern 115B is formed over the whole back surface of substrate 115A.

In the vicinity of said strip type transmission line 115 is a movable conductive member 119 constituting frequency adjusting section, and the movable conductive member 119 is fixed, after adjusted by shifting, with a gluing agent(an example of the maintaining means) 120. In PLL 111, output of oscillator 103 is connected to frequency divider 118. The output of frequency divider 118 is connected to one side of phase comparator 113, while the output of phase comparator 113 is connected to said low pass filter 112. Reference oscillator 116 is connected with reference frequency divider 117, the output of reference frequency divider 117 is connected to the other input of said phase comparator 113. Both said divider 118 and said reference frequency divider 117 are connected to a control input terminal 114, and the dividing ratio is varied according to signal from the control input terminal 114.

As the stepping of frequency change gets coarse with the high setting of reference frequency to be inputted to phase comparator 113, a modulus type frequency divider, with which the dividing ratio is variable, is used as the frequency divider 118 for making the stepping quantity of variable frequency finer.

With a high frequency apparatus constituted as above, the operation is described in the following. High frequency digital signal is inputted to input terminal 101 to be delivered to mixer 104 via input circuit 102. Here, an intermediate frequency signal is obtained after being mixed with an oscillation frequency outputted from first oscillator 103. The intermediate frequency signal goes through filter 105 to be multiplied by a signal of second oscillator 109 at an I/Q detector 106; then I signal and Q signal are obtained. The second oscillator 109 is controlled by an AFC terminal 110 in its oscillation frequency.

In the first oscillator 103, a variable capacitance diode 126 constitutes the capacitance component of variable tuning circuit, the capacitance value of variable capacitance diode 126 changes according to control voltage from low pass filter 112. The oscillation frequency of first oscillator 103 is thus controlled.

The oscillator has to cover a frequency range 1430–2530 MHz. For this purpose, adjustments are made to absorb the dispersions in component constant and mounting status of electronic components constituting a tuning circuit (hereinafter simply referred to as dispersion) for enabling to cover an entire range of input signals inputted from input terminal 101. Because a strip type transmission line 115 of a certain pattern is used as the inductance, no specific inductance component is needed for the portion; which contributes to rationalize the assembly steps etc.

Now in the following, adjusting procedure of tuning circuit for absorbing the dispersion will be described. By moving the movable conductive member 119 closer or farther to strip type transmission line 115, an equivalent inductance value of the strip type transmission line 115 changes; which enables adjustment of tuning frequency of variable tuning circuit of oscillator 103. Namely, the inductance value is shifted to absorb dispersions in the component constant of oscillator 103 and in the stray capacitance due to dispersion in positioning of mounted components, for obtaining an optimum value.

Meanwhile, shift of inductance value due to deformation of movable conductive member 119 caused by vibration, long term temperature cycling etc. has to be prevented. For this purpose, an adjusting is conducted for absorbing the dispersions, and then movable conductive member 119 is fixed by applying a gluing agent 120. A stabilizing measure has thus been taken against the long term deformation.

However, the gluing agent 120, whose specific dielectric constant is larger than the air, increases the stry capacitance causing a substantial dielectric loss to a deteriorated Q of tuning circuit of oscillator 103. This eventually increases the phase noise of oscillator 103, which poses a great task to be solved in the high frequency apparatus.

Then the phase noise has to be reduced low enough so as no trouble due to the bit error rate would arise in digital signal reception. In order to solve the issue, phase noise has to be reduced through a high loop band width. The loop band width was about 60 Hz in the conventional reception of analog modulated high frequency signals. In the reception of digital modulated high frequency signals according to the present embodiment, however, the loop band width is set at approximately 7 kHz and the phase noise has been improved for about 40 dB. Conventionally, the phase comparative frequency was about 3 kHz, but in the present embodiment it has been set at approximately 360 kHz. In some cases, the loop band width is set at approximately 10 kHz; when, the phase comparative frequency is approximately 500 kHz.

FIG. 2(*a*) is a perspective view showing details of the first oscillator 103 of FIG. 1. FIG. 2(*b*) is a side view showing the vicinity of movable conductive member 119 as seen from symbol AA. In FIG. 2, the movable conductive member 119 is comprised of two reverse L-shaped feet 119*a* and a main body 119*b* bridging the feet. The main body 119*b* to be magnetically coupled with a strip type transmission line 115 is diposed in a space above an open end, either 115*a* or 115*b*, at approximately above the middle of the width, in approximately parallel with the strip type transmission line 115. With the above arrangement, an adjusting range of about 100 MHz is obtainable in the oscillation frequency. Namely, a relatively wide adjusting range of oscillation frequency has been obtained because the main body 119*b* is disposed on an open end, either 115*a* or 115*b*.

A gluing agent 120 is applied so as the relative positioning between movable conductive member 119 and strip type transmission line 115 does not change; it stays stable against variations such as the long term temperature cycle, etc. In the present embodiment, a solvent type rubber group adhesive has been used as the gluing agent 120. Adhesive of silicone group, epoxy group, phenol group, etc. may also be used for the purpose. In view of the work efficiency, what is preferred is those adhesives setting in room temperature.

For a narrow oscillation frequency adjusting range, e.g. 30 MHz, the movable conductive member 119 may be disposed on an approximate centre 115*c* of strip type transmission line 115. Although the adjusting range is narrow, the adjustment is easy.

Figure 3:
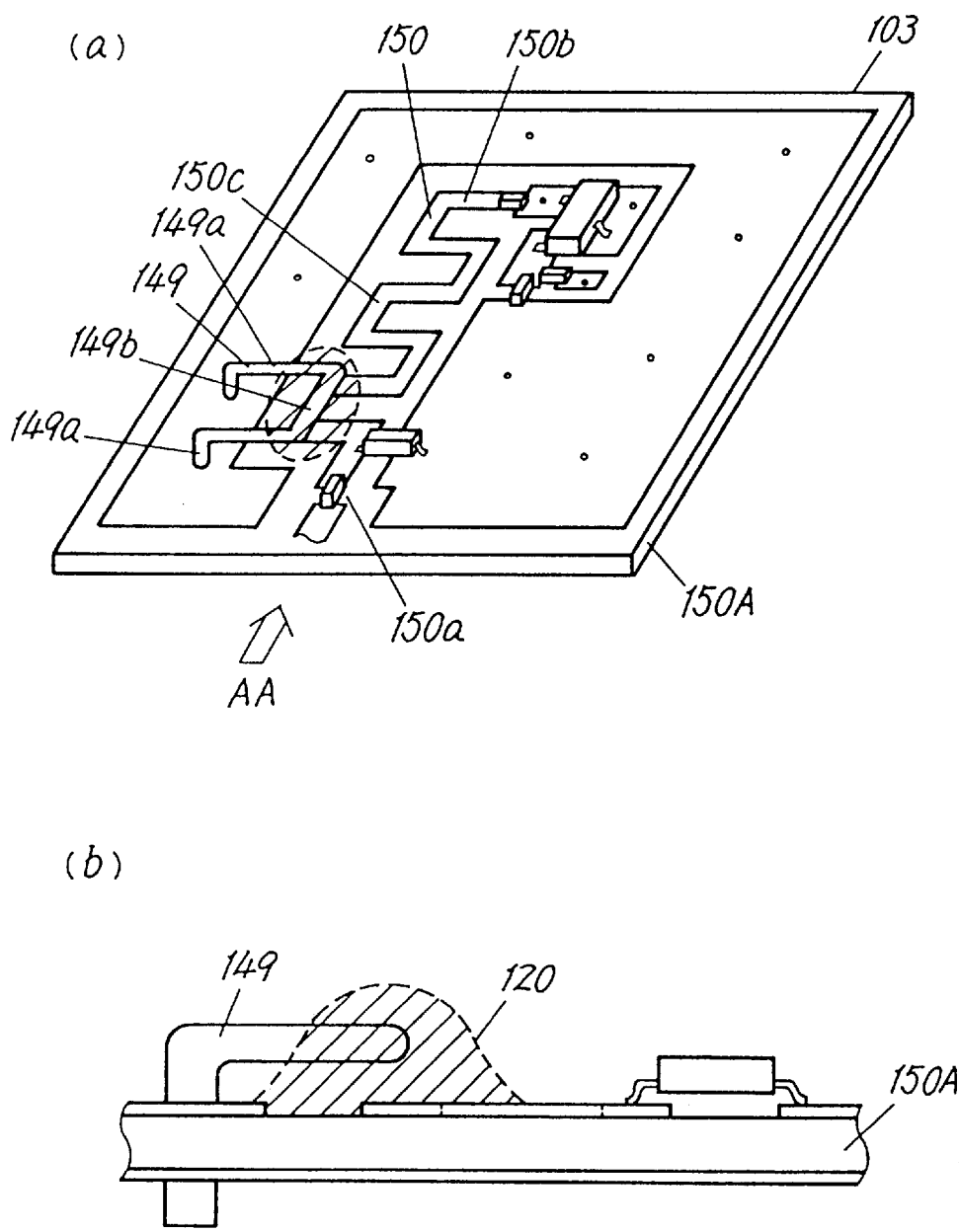
FIG. 3(a) is a perspective view of a local oscillator according to other embodiment in the high frequency apparatus of FIG. 1.
FIG. 3(b) is a side view showing a key part of FIG. 3(a).

FIG. 3(*a*) is a perspective view showing details of other example of the first oscillator 103 of FIG. 1. FIG. 3(*b*) is a side view showing the vicinity of movable conductive member 149 as seen from symbol AA. In FIG. 3, a movable conductive member 149 is comprised of two reverse-L shaped feet 149*a* and a main body 149*b* bridging the feet. The main body 149*b* to be magnetically coupled with a strip type transmission line provided on substrate 150A is disposed in a space above one open end, either 150*a* or 150*b*, in approximately parallel with strip type transmission line 150. Here, an adjustable range of approximately 80 MHz is obtained in the oscillation frequency. Namely, a relatively wide oscillation frequency adjusting range has been obtained because the main body is disposed above one open end, either 150*a* or 150*b*. The strip type transmission line 150 has been formed in a shape of continuation of letters L. By so doing the mounting area on substrate 150A can be saved. A same effect is obtainable with a continuation form of letters S.

For a narrow oscillation frequency adjusting range of approximately 20 MHz, the movable conductive member 149 may be disposed on an approximate centre 115*c* of strip type transmission line 150. In this case, the adjustment turns out to be easy because of the narrow adjusting range.

In the same manner as in the previous example, the movable conductive member 149 and the strip type transmission line are glued by the gluing agent 120 to avoid shift of the relative positioning. A grounding pattern 150B is provided over the whole back surface of substrate 150.

Embodiment 2

In some cases where oscillation frequency is low the use of strip type transmission line 115 or 150 as an inductance element may be inappropriate, because the size will become too large. When oscillating a VHF frequency, for example, the tuning section may be formed using an empty-cored coil or a flat plate transmission line as the inductance element. In this case, inductance value is adjusted by changing the shape of empty-cored coil or flat plate transmission line, to improve the dispersion of oscillation frequency. In order to maintain the empty-cored coil or flat plate transmission line stable against the long term temperature cycle etc., it is fixed with a gluing agent in a same way as the embodiment described above.

Figure 4:
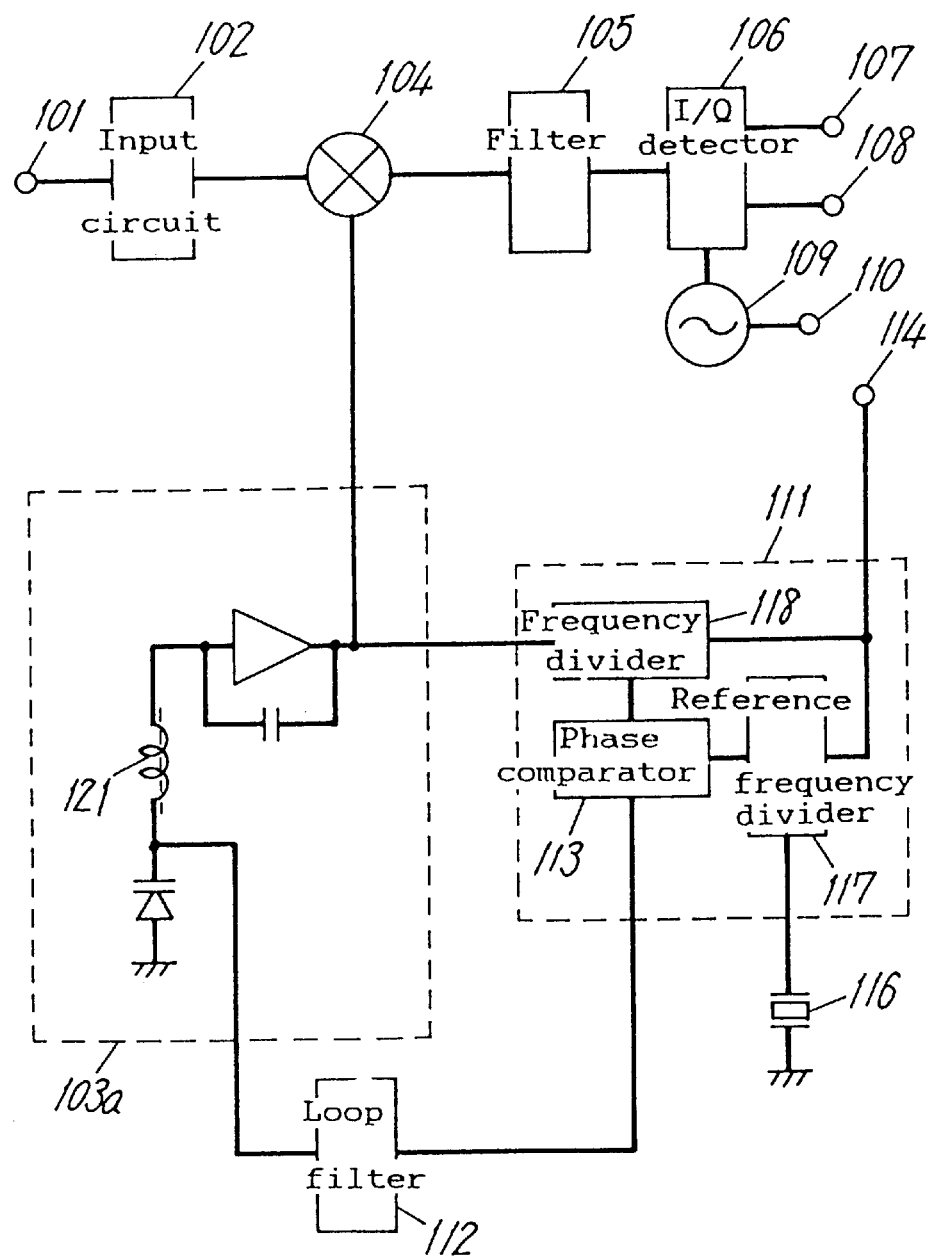
FIG. 4 is a block diagram showing high frequency apparatus according to Embodiment 2 of the present invention.

An embodiment 2 is shown in FIG. 4 and FIG. 5. FIG. 4 shows an example where the strip type transmission line 115,150, movable conductive member 119,149 and gluing agent 120 of FIG. 1, FIG. 2 or FIG. 3 have been replaced with inductance element 121.

FIG. 5(*a*) shows an example of the inductance element 121. The inductance element 121 is comprised of a core of insulator 122 having an electrode 124 at both ends, and a coil 123 wound around the insulator 122. The value of inductance element 121 is adjusted through the change in winding pitch of coil 123, which is done by inserting tweezers in a groove 122a formed in the side opposite to electrode 124. The coil 123 of inductance element 121 stays stable, without gluing, against temperature cycles etc., because it is wound around insulator 122 and kept as it is by friction with the insulator. Namely, the friction between coil 123 and insulator is the maintaining means. The coil 123 may withstand some external force against deformation.

Because there is an dielectric loss in the insulator 122, the phase noise generated in oscillator 103a has been reduced by raising the loop band width, in a same manner as in the previous exemplary embodiment. As a result, the phase comparative frequency of phase comparator 113 also rises. Regarding the increased frequency gap in the receiving frequency caused as the result of raised phase comparative frequency, a coarse tuning of receiving frequency is conducted at PLL 111 and first voltage controlled oscillator 103a, and fine tuning at AFC terminal 110 of second oscillator 109 of I/Q detector 106. A stable high frequency apparatus is thus implemented.

FIG. 5(b) is other example of the inductance element 121 of FIG. 4. In FIG. 5(b), numeral 171 denotes an insulator of cylindrical shape, the inner wall surface of through hole 171A of which is provided with a female screw 172. In order to insure a strength, the bottom of through hole 171A may be sealed. Numeral 173 denotes a conductor, which is wound around the outer surface of insulator 171. The outer surface has a column shape in the present example, but it is not limited to the shape. Numeral 174 denotes a movable core formed with a magnetic material, which is provided with a male screw 175 on the outer surface fitting to the female screw 172 of said through hole 171A. The movable core 174 is provided with a minus(-) shaped groove 176 at the top; by turning the movable core with a driver, for example, inserted in the groove 176 the movable core 174 makes fine up/down (in the Fig.) movement inside the insulator 171. Numeral 177 denotes a metal shield case covering the insulator 171. Numeral 178 denotes a hole provided at the top of shield case 177, through which hole said movable core 174 can be turned from the outside. It is also possible to provide a groove 179 in the outer surface of insulator 171a and wind said conductor 173 in the groove 179.

The inductance value is adjustable by turning the movable core 174. As the conductor 173 has been wound around a core, it is not deformed easily even if an external force is given. Further, as the movable core 174 is coupled with insulator 171 by means of a screw, and both are fixed together by a friction between the two (the friction is acting as the maintaining means), the position of movable core 174 is maintained fixed for a long term even without application of a gluing agent. The adjustment is easy, because the inductance value is adjusted by a revolving motion. An inductance more stable against vibration is obtainable by providing a groove 179 around the outer surface of insulator and winding the conductor 173 around the groove 179, FIG. 5(c).

The oscillation characteristic of tuning section, however, deteriorates due to the dielectric loss of insulator 171 and the magnetic loss of movable core 174. Therefore, the phase noise at voltage controlled oscillator 103a is reduced by raising the loop band width. As a result, the phase comparative frequency of phase comarator 113 also goes high.

Regarding the increased frequency gap in the receiving frequency caused as the result of raised phase comparative frequency, a coarse tuning of receiving frequency is made at PLL 111 and first voltage controlled oscillator 103a, and fine tuning at AFC terminal 110 of second oscillator 109 of I/Q detector 106. A stable high frequency apparatus is thus implemented.

Embodiment 3

Figure 6:
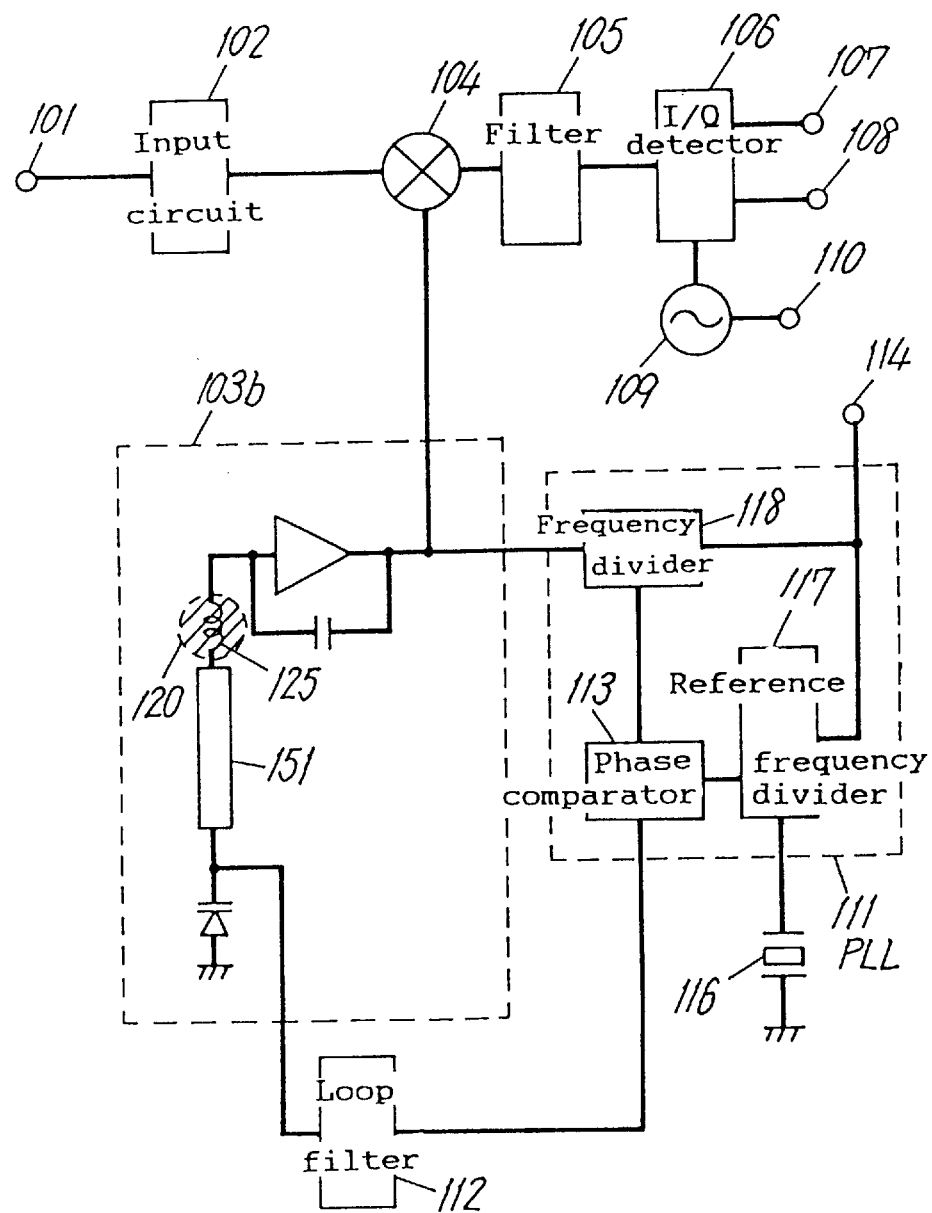
FIG. 6 is a block diagram showing high frequency apparatus according to Embodiment 3 of the present invention.

An exemplary embodiment 3 of the present invention is shown in FIG. 6 and FIG. 7. FIG. 7 is the first voltage controlled oscillator 103b of FIG. 6.

FIG. 7(a) shows an outline of the first voltage controlled oscillator 103b, FIG. 7(b) is a side view showing the vicinity of movable conductive member 125 as seen from the symbol BB. An inductance element is formed with a movable conductive member 125 and a strip type transmission line 151; the dispersion etc. of components constituting first voltage controlled oscillator 103b is absorbed through the adjustment of said movable conductive member 125. And then fixed with a gluing agent 120, against the change in temperature cycles, vibration, etc. As the movable conductive member 125 is provided connected in series to strip type transmission line 151 it is not necessary to dispose a movable conductive member in the vicinity thereof, as against an embodiment of FIG. 1. This contributes to reduce the occupation area of substrate 151A, and to reduce the size of an apparatus.

A movable conductive member 125(a) as shown in FIG. 7(c) may be used for the movable conductive member 125. In this case, the movable conductive member 125a is not mounted through substrate 151A, but may be attached on the upper surface of substrate 151A for adjustment, and fixed with gluing agent 120 approximately at the middle.

Embodiment 4

Figure 8:
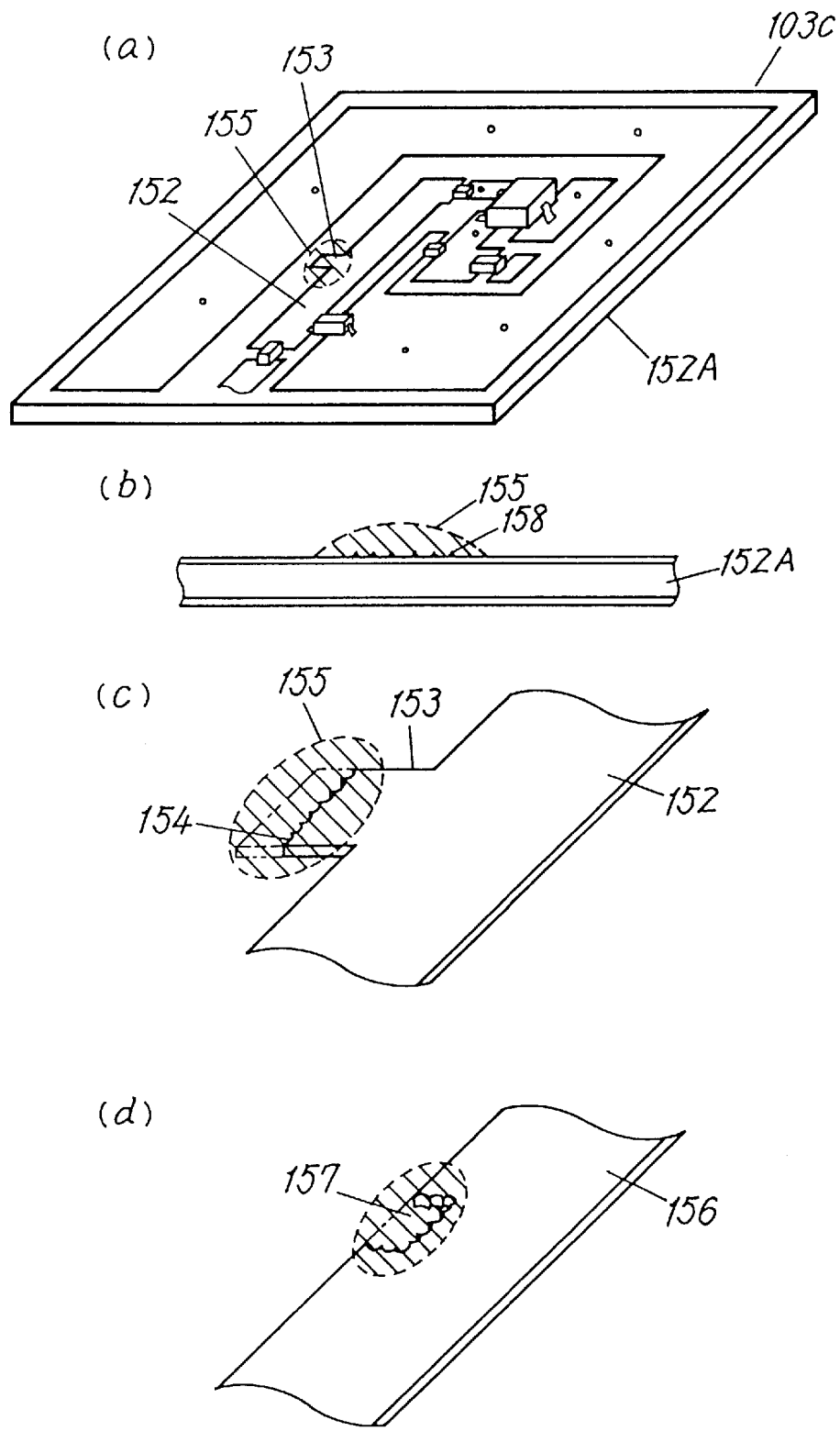
FIG. 8(a) is a perspective view of local oscillator according to Embodiment 4 of the present invention.
FIG. 8(b) is a side view showing adjusting section of the local oscillator of FIG. 8(a).
FIG. 8(c) is a perspective view showing adjusting section of the local oscillator of FIG. 8(a).
FIG. 8(d) is a perspective view of a second exemplary adjusting section.

An exemplary embodiment of the present invention is shown in FIG. 8. FIG. 8(a) is a perspective view showing other example of a first voltage controlled oscillator, indicated as 103c. FIG. 8(b) is a cross sectional view of the key portion, FIG. 8(c) a perspective view of the key portion. FIG. 8(d) is a perspective view showing still other example.

In FIG. 8(a), numeral 152 denotes a strip type transmission line constituting the inductance of tuning section. At a side of the strip type transmission line 152 is an extrusion 153 for adjusting the inductance value thereof. The inductance is adjusted to a specified value by laser-trimming the extrusion, as shown in FIG. 8(c). A cover material 155 is applied on a section 154. The reasons why the cover material is applied include; firstly, for protecting the section 154 explored by cutting extrusion 153 from oxidation, secondly for preventing a change in the dielectric constant of substrate which could be brought about as a result of absorption of humidity by a carbide formed when laser-trimming a resist (not shown) printed on the extrusion 153 including strip type transmission line 152, or that formed during laser-trimming conducted on a phenolic group thermo-setting resin substrate 152A. Thus an adjusted inductance value is maintained by virtue of the cover material 155.

However, when such a cover material 155 is employed the Q of tuning section drops due to dielectric loss of the cover material 155. Therefore, the phase noise at voltage controlled oscillator 103c has been reduced by widening the loop band width of control loop.

The adjusting section may be formed also by laser-trimming the strip type transmission line 156 to an indention, as shown in FIG. 8(d). A laser-trimmed section 154 makes a rough surface 158; the application of cover material 155 is effective for protecting the rough surface 158.

Embodiment 5

In embodiment 5, a still other exemplary first oscillator 103d is described, a perspective view of which is shown in FIG. 9(a). In FIG. 9, numeral 159 denotes a strip type transmission line provided on a substrate 159A, and forming a tuning section of local oscillator. Numeral 160 denotes a movable conductive member connected in series to the strip type transmission line 159. Numeral 161 denotes an adjusting section provided extruded in a side of said strip type transmission line 159. Numeral 159B denotes a grounding pattern.

With the tuning section described above, adjusting method will be described in the following. In the first place, as shown in FIG. 9(c), said adjusting section 161 is cut 162 roughly by laser for coarse adjustment of inductance. Then, the inductance is fine-adjusted by movable conductive member 160. After being adjusted, the adjusting section 161 is applied with a cover material 155 so as to prevent oxidation of the cut section and absorption of humidity by a carbide formed as a result of carbonization of substrate, or resist. The movable conductive member 160 is applied with a gluing agent 120 for maintaining an adjusted value.

As described above, in the exemplary embodiment 5 the adjustment is easy, because a coarse adjustment is done in adjusting section 161 and then fine-adjusted by movable conductive member 160. A precise adjustment is thus conducted.

In embodiments 4 and 5, a laser trimming was described. However, trimming by drilling or other machining procedures also serve the same purpose, on an economical facilities investment.

Embodiment 6

Figure 10:
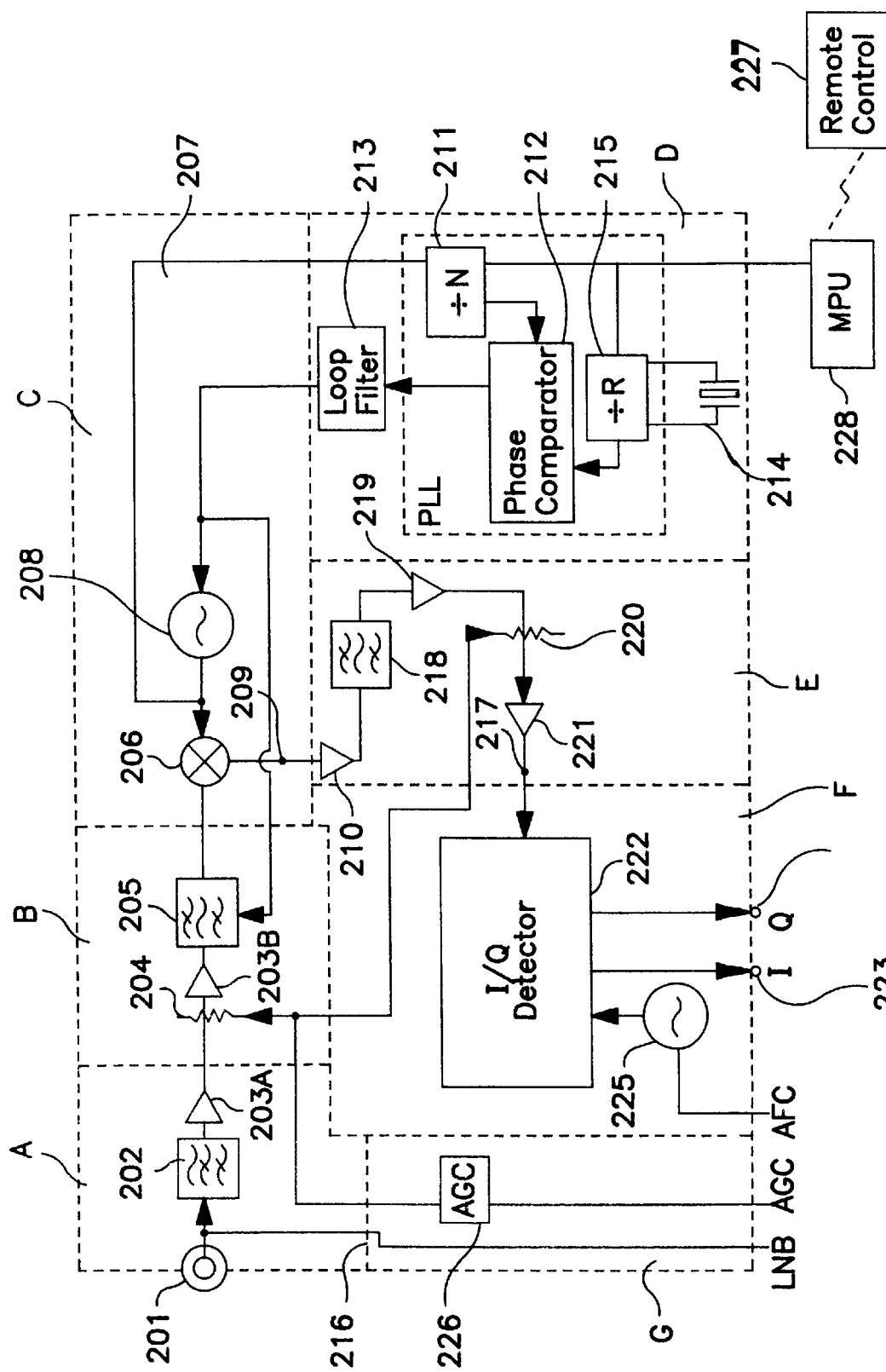
FIG. 10 is a block diagram of high frequency apparatus according to Embodiment 6 of the present invention.

In FIG. 10, numeral 201 denotes an input terminal, for receiving digital modulated high frequency signals. To the input terminal 201, a high-pass filter 202, an amplifier 203A, a variable attenuator 204, an amplifier 203B and a tuning filter 205 are connected; output of the tuning filter 205 is supplied to an input of a mixer 206. To the other input of mixer 206, an output signal from a voltage controlled oscillator 208 of local oscillator 207 is supplied, and output of the mixer 206 is delivered to an amplifier 210 via output terminal 209 of mixer 206. In the output side of voltage controlled oscillator 208 of local oscillator 207, a frequency divider 211, a phase comparator 212 and a loop filter 213 are connected; output of the loop filter 213 is delivered to input of voltage controlled oscillator 208 and tuning filter 205. Signal from a quartz oscillator 214 is delivered as reference signal to phase comparator 212 after being divided at a frequency divider 215.

A tuner section is constituted by blocks A, B, C, D and E defined by separating plate 216 indicated with dotted lines; an output terminal 217 of the tuner is provided in block E. Inside the block E, said amplifier 210, an intermediate frequency tuning filter 218, an amplifier 219, a variable attenuator 220 and an amplifier 221 are provided.

A block F is I/Q detecting section; to the output terminal 217 of tuner section an I/Q detector 222 is connected, from the I/Q detector 222 an output terminal 223 for outputting I signal and an output terminal 224 for outputting Q signal are drawn. A voltage controlled oscillator 225 is connected to the I/Q detector 222, for supplying frequency control voltage(AFC).

In a block G, a gain control circuit(AGC) 226 for supplying control voltage to tuner section is provided, an AGC signal is delivered thereto. To an exterior low noise converter (LNB), a voltage is supplied via input terminal 201 to exterior antenna section. Thus, a signal of 1–2 GHz band, for example, is inputted through input terminal 201 which also functions as voltage supply terminal.

Figure 11:
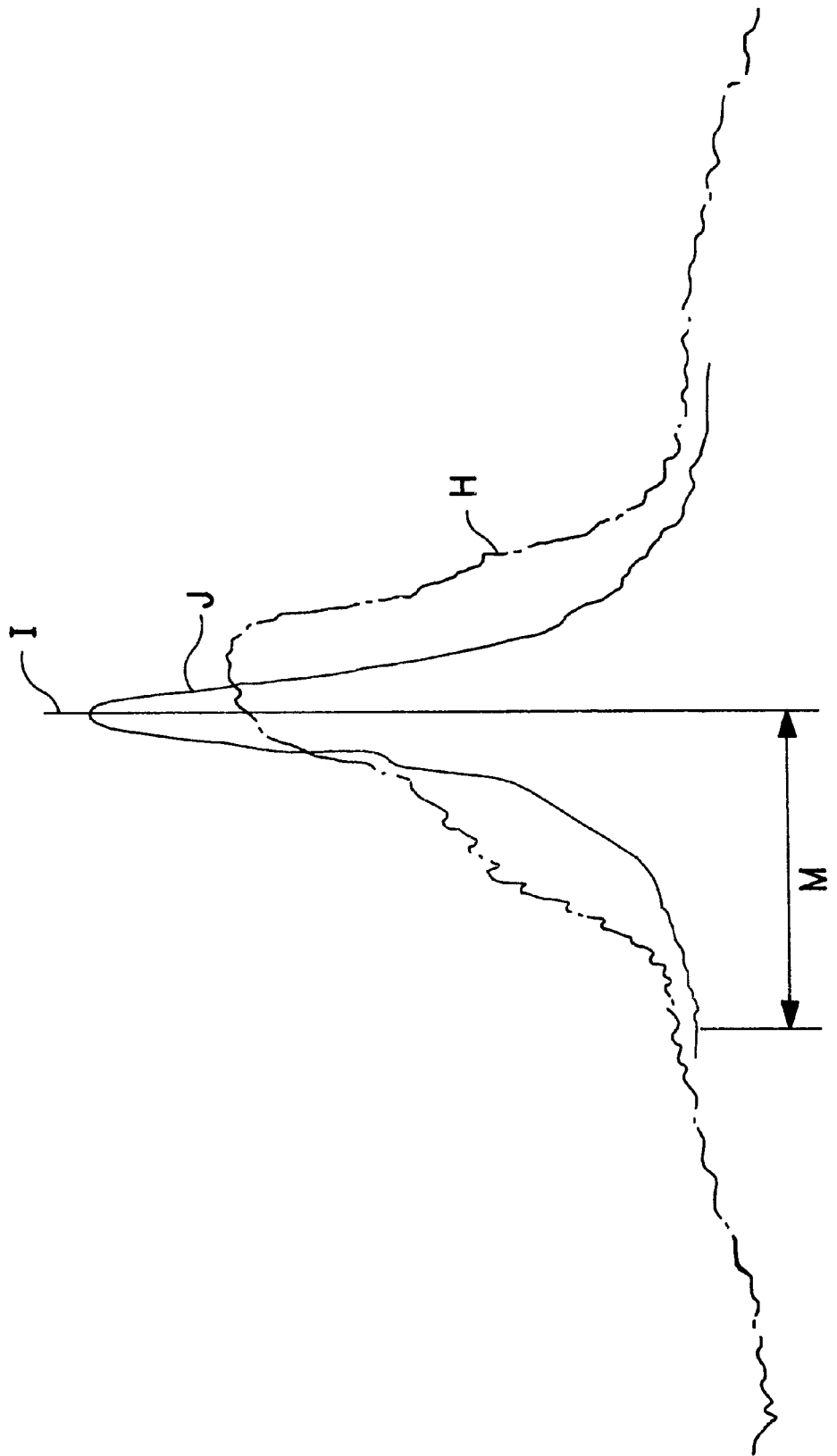
FIG. 11 is a first frequency characteristics chart for explaining characteristics of local oscillator of the high frequency apparatus of FIG. 10.

In the present embodiment, the frequency distribution characteristic of output signal delivered solely from the voltage controlled oscillator 208 widely deviates up and down, as the line indicated by H in FIG. 11, from a desired center frequency I(e.g. 1.8 GHz). A control loop which is connected to the voltage controlled oscillator 208 and is comprised of a frequency divider 211, a phase comparator 212 and a loop filter 213, and a frequency divider 215 connected to phase comparator 212, and a quartz oscillator 214 are for correcting the distribution characteristic to a frequency distribution characteristic curve indicated by J.

In the present embodiment, the dividing ratio of frequency divider 211 is set small(e.g. about 4000–7000) for raising the response characteristic. Meanwhile, the reference signal to be delivered from frequency divider 215 to phase comparator 212 is set high (e.g. 360 kHz).

The noise component of voltage controlled oscillator 208 alone is removed by said control loop, and a desired frequency distribution characteristic having least noise component is obtained as indicated by J in FIG. 11.

Now in the following, the effect of the loop band width is described referring to FIG. 12(a). If the loop band width of said control loop is narrow the frequency distribution characteristic of voltage controlled oscillator 208 alone(curve H) is not sufficiently corrected at the skirt portion, resulting in an unfavourable distribution(curve K). Namely, in FIG. 12(a), symbol L indicates a case when the loop band width of control loop is small, 5 kHz for example. In this case, the frequency is correctable up to 5 kHz up and down the center frequency I; in the further portion exceeding the loop band width of control loop no correction is available.

Symbol M indicates a case when the loop band width of control loop is high. Suppose M is 7 kHz, the frequency is corrected up to 7 kHz up and down the center frequency I. As a result, a region corresponding to curve K is also converged very close to the center frequency I, as indicated by curve J; the noise region is decreased up to M, versus the noise region at L.

In the present invention, the loop band width of control loop has been made high enough not to be dominated by noise of voltage controlled oscillator 208; symbol M in FIG. 11 and FIG. 12 (a) equals to approximately 7 kHz. As a result, an ideal output signal is obtained in which it is converged very close to center frequency I as indicated by J and is not dominated by noise of voltage controlled oscillator 208 even when the noise is large. As the above output is supplied to mixer 206, appropriate tuning and I/Q detection are performed. Furthermore, as the dividing ratio of frequency divider 211 is small the response at channel switching, for example, is very high.

The affection of reference frequency signal upon phase noise is described with reference to FIG. 12(b). An issue here is the signal level of reference frequency signal to be delivered to phase comparator 212 in a same frequency excluding the substantially central frequency.

In a case when the level of reference frequency is greater than level of signal from voltage controlled oscillator 208 before the correction by loop band width(viz. comparative signal to be delivered from frequency divider 211 to phase comparator 212), as indicated by N in FIG. 12(b), or when the signal level of the frequency distribution characteristic at the vicinity of center frequency of reference frequency signal is larger, in comparison with frequency distribution characteristic of signal level at the vicinity of center frequency to be outputted from local oscillator 207 to mixer 206, than a signal level to be corrected by the high loop band width in a same off-set frequency from the center frequency excluding an area substantially the center of frequency(as indicated by 0 in FIG. 12(b)), correction by the control loop is difficult for the exceeding region as there is much reference frequency signal noise to be compared(for example, the shadowed portion by P of line 0 in the latter case in FIG. 12(b). Meanwhile, no correction at all for line N in the former case.) even if the loop band width was widened.

On the other hand, when a source of oscillating reference frequency signal is selected, the level of which being purer than at least the signal of voltage controlled oscillator 208 before the correction by loop band width and not affecting the correction effect of high loop band width(line Q in FIG. 12(b) for example), the correction effect of high loop band width is available more economically.

In FIG. 10, numeral 227 denotes a controller for channel switching etc. Signals from which are delivered to frequency dividers 211, 215 via a microprocessor unit 228.

Figure 13:
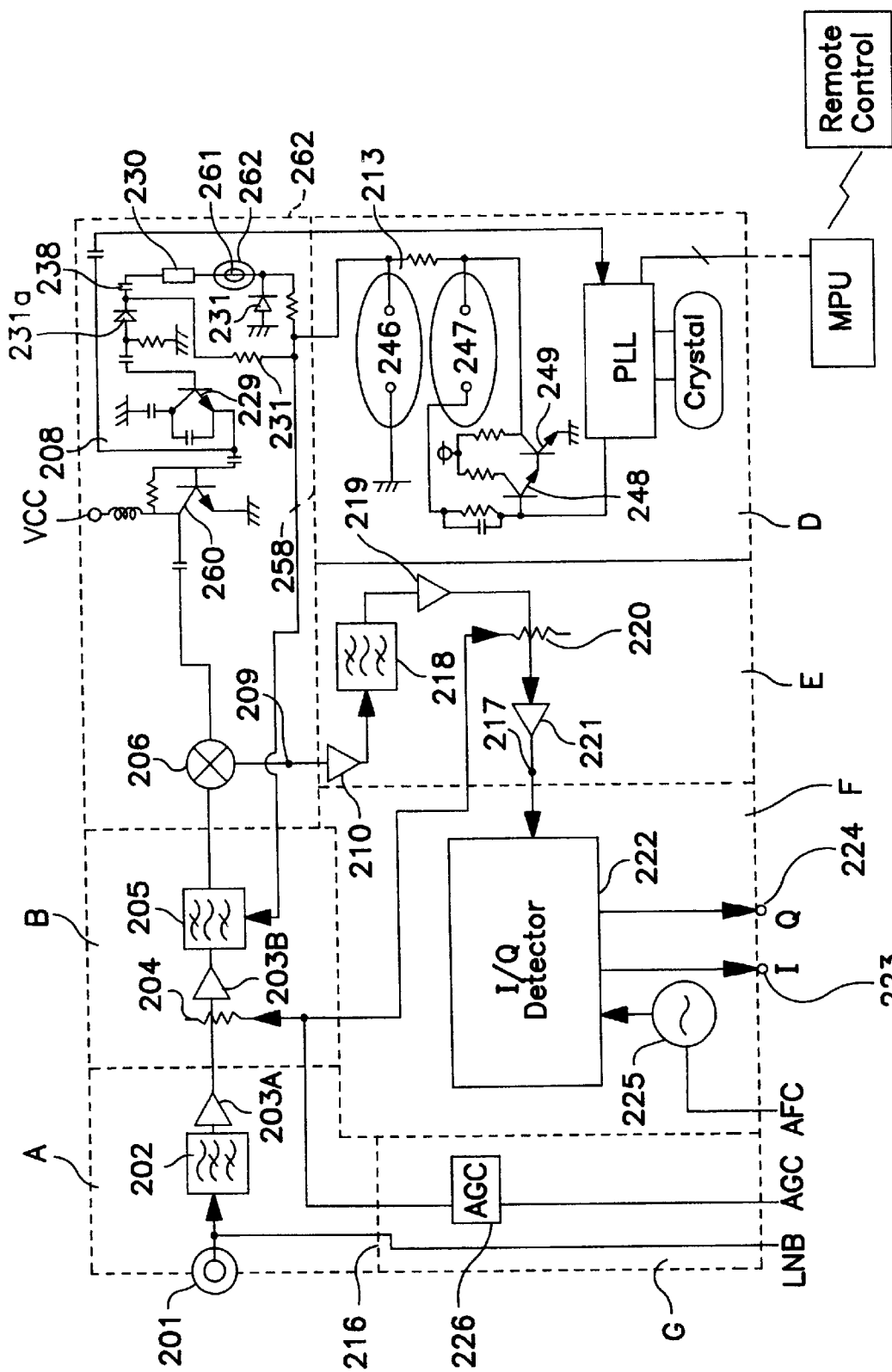
FIG. 13 is a detailed block diagram showing the high frequency apparatus of FIG. 10.
Figure 14:
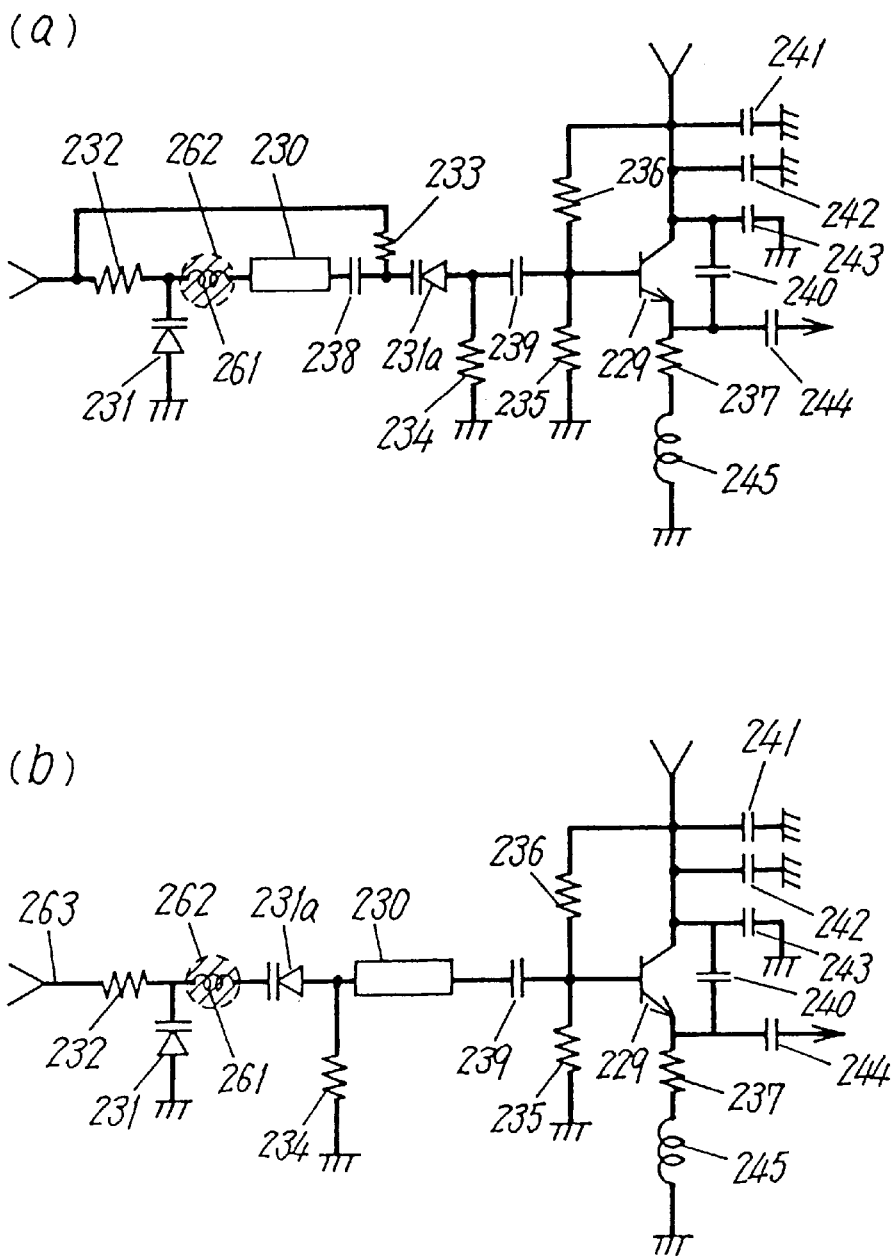
FIG. 14(a) is a first exemplary circuit diagram of voltage controlled oscillator of the high frequency apparatus of FIG. 10.
FIG. 14(b) is a second exemplary circuit diagram of voltage controlled oscillator of the high frequency apparatus.

FIG. 13 illustrates the blocks C and D more in detail. Voltage controlled oscillator 208 is comprised of an oscillating section having a transitor 229 as the main component and a tuning section having a strip type transmission line 230 provided on substrate and varactor diodes 231, 231a. FIG. 14(a) illustrates the above described constitution in an ease-to-see manner. In FIG. 14(a), numerals 232, 233 and 234 denote resistors for applying voltage, 235, 236 and 237 are resistors for bias, 238 and 239 are capacitors for temperature compensation, 240 is a capacitor for feedback, 241, 242 and 243 are capacitors for grounding, and 244 is a capacitor for output.

Numeral 245 denotes an inductance for impedance aligning, which is formed on substrate in a certain pattern shape. Numeral 261 denotes a movable conductive member for adjusting the inductance of tuning section, which was described in detail in embodiment 3 or 5 above. Numeral 262 denotes a gluing agent, which is intended like in the above embodiment to fix said movable conductive member 261 for maintaining the inductance value stable for a long term.

Figure 15:
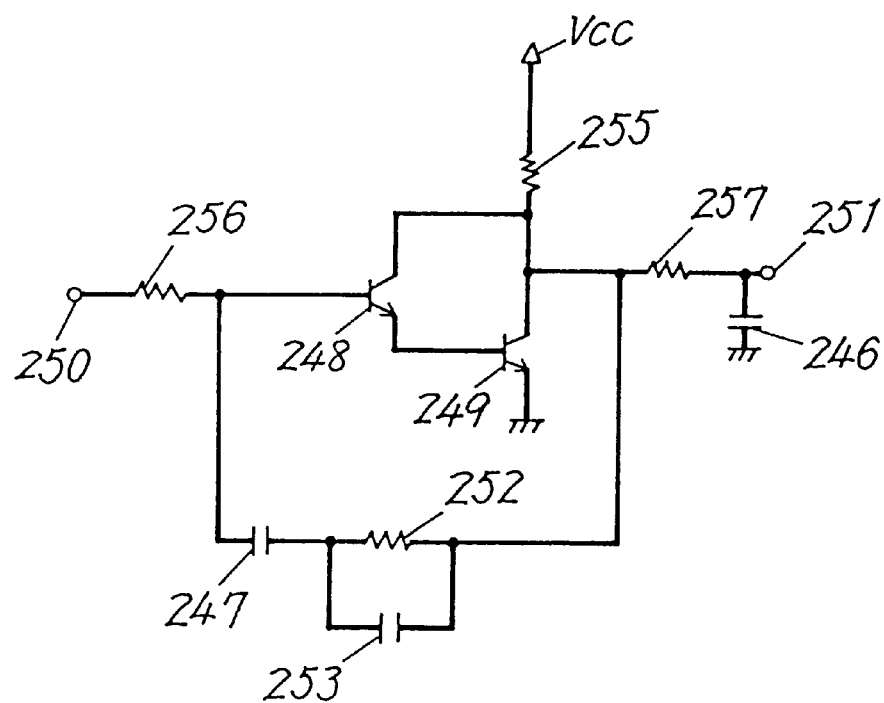
FIG. 15 is a circuit diagram showing loop filter of local oscillator in the high frequency apparatus of FIG. 10.

Back to FIG. 13, a loop filter 213 is comprised of capacitors 246, 247 and transistors 248, 249, etc., detail of which is shown in FIG. 15. Signal from phase comparator 212 is inputted from an input terminal 250, to be amplified by an amplifier comprised of darlington-connected transistors 248 and 249, and goes to an output terminal 251. A part of the signal goes via capacitor 247 to transistor 248 as feedback, by which a filtering operation is performed.

In FIG. 15, numeral 253 denotes a capacitor, 255, 256 and 257 resistors. Film capacitors have been used for the capacitors 246 and 247, with the view to an anti-vibration property. Namely, if ceramic capacitors are used for these capacitors unwanted voltage is generated by the piezoelectric effect due to vibration, which deteriorates the phase noise. Therefore, film capacitors with lead wires, which bear least piezoelectric effect, have been employed.

In FIG. 13, the capacitor 246 is a film capacitor, which is considerably large sized. Taking advantage of the size, an opening provided in a separating plate 216 disposed between blocks C and D for allowing a line 258 which connects capacitor 246 and strip type transmission line 230 to go through is covered with the capacitor 246, by disposing the capacitor 246 in block D at a place close to the opening. The above structure is one of considerations to suppress the transmission of noise between block C and D through the opening as small as possible.

The film capacitors 246, 247 are vulnerable to high temperature. These capacitors 246, 247 are mounted on substrate by inserting the lead wires into through holes of the substrate to be soldered with a conductive pattern provided on the back surface of substrate. What is important is that neither of the through holes is provided with electrode in the inside. This is for preventing the solder from going into the through hole and conveying the heat to capacitors 246, 247.

The strip type transmission line 230 has been disposed close to the separating plate 216 or wall of metal case 259 of C, in FIG. 13. This is a part of considerations to suppress a noise invading onto the strip type transmission line 230 as small as possible. In FIG. 13, a transistor 260 is for amplifying signals.

In FIG. 14(a), a small capacitance(several pF—several tens pF) chip capacitor 238 is placed between strip type transmission line 230 and varactor diode 231a, for raising the impedance of the line. The above represents a consideration to minimize an influence to be caused by substantial change in the length etc. of lead wire of varactor diode 231a, which occurs as a result of soldering etc.; through raising of the impedance by the chip capacitor 238.

The varactor diode 231a is heavier than the chip capacitor 238, and no self-alignment effect is expectable in a reflow soldering. Therefore, substantial length of lead wires disperses and the impedance is not uniform. On the other hand, as the chip capacitor 238 is light in weight, the mounting position becomes uniform because of the self-alignment effect in reflow soldering. Therefore, the inductance of strip type transmission line 230 becomes uniform. Although there is a possibility for the inductance between chip capacitor 238 and varactor diode 231a to disperse, the dispersion of oscillation frequency is suppressed by the high impedance brought about by the chip capacitor 238.

A further smooth temperature compensation characteristic is presented by providing a chip capacitor 239, in addition to the chip capacitor 238, as the temperature compensation capacitor, as shown in FIG. 14(a). Thus a voltage controlled oscillator is implementable that functions stable against temperature change.

FIG. 14(b) shows an exemplary embodiment, in which the chip capacitor 238 in FIG. 14(a), being provided for reducing the dispersion around strip type transmission line 230, is eliminated, yet a favourable tuning section is presented. In FIG. 14(b), an input terminal 263 of oscillation frequency control voltage is connected to the cathode of a varactor diode 231 via a resistor 232, the anode being grounded. Between the connecting point of said resistor 232/varactor diode 231 and an oscillating transistor 229, a movable conductive member 261, a varactor diode 231a and a strip type transmission line 230 are serially connected in the order, with said strip type transmission line 230 connected to the transistor 229. The inductance of movable conductive member 261 being approximately 6 nH, the strip type transmission line 230 being formed by a printed pattern, 4–6 mm long, approximately 1 mm wide.

Now in the following, description will be made on a supposed structure where both movable conductive member 261 and strip type transmission line 230 are disposed between the cathodes of varactor diodes 231 and 231a. As there exists, between the varactor diodes 231 and 231a, the stray capacitance of both movable conductive member 261 and strip type transmission line 230, the tuning frequency range becomes broader in proportion to the size of said stray capacitance than in a case where the cathodes of varactor diode 231 and varactor diode 231a are simply connected. The tuning frequency range must be broadened to a certain desired range; however, if broadened too much exceeding the range the tuning sensitivity(the ratio of tuning frequency shift with respect to the capacitance change in varactor diode 231a) goes high, therefore, when a noise jumps in the loop filter 213 a resultant voltage causes a larger change in the frequency of voltage connection oscillator. This invites a drawback of increased phase noise. Therefore, there must be an optimum value in the stray capacitance between varactor diodes 231 and 231a.

When an effort is made to reduce the value of stray capacitance of movable conductive member 261 and strip type transmission line 230 in search for the optimum value, the surface area goes small in each of the two. As a result, the resistance increases due to loss by the surface effect, and the Q value goes down deteriorating the phase noise. This means that the values of respective stray capacitance need to be higher than a certain specific level, which poses a limit in lowering the tuning sensitivity.

After all, it is known that in order to optimize the stray capacitance between the varactor diodes 231 and 231a either the movable conductive member 261 or strip type transmission line 230 has to be moved to a region between varactor diode 231a and oscillating transistor 229. It is important, in this case, to move the strip type transmission line 230, not the movable conductive member 261. With the above structure, where the strip type transmission line 230 having fixed inductance is disposed in the side of oscillating transistor 229, an instable coupling due to harmonic mode does not occur, making adjustment easy. If the movable conductive member 261 is disposed in the side of transistor 229 the movable conductive member 261 and the transistor 229 get close to each other, and an instable coupling occurs due to harmonic mode, depending on how the movable conductive member 261 is adjusted; therefore a stable oscillation is not obtainable.

Back to the main story, in a case where there are elements of, for example, a variable capacitance varactor diode 231a of approximately 1 pF–15 pF, a strip type transmission line 230 and a movable conductive member 261 for adjusting, the tuning sensitivity may be lowered further, within a range where appropriate tuning is secured(oscillation frequency range 1330 MHz–2700 MHz), by disposing only the movable conductive member 261 in a region between cathodes of varactor diodes 231 and 231a. In the above structure, the varactor diode 231a is disposed in between without substantially splitting the movable conductive member 261 or the strip type transmission line 230; therefore, the mounting efficiency is high, while the securing of tuning of input signal and the reduction of phase noise are well balanced.

Now in the following description is made on making the loop band width high. Referring to FIG. 10, the reference frequency may be raised by making dividing ratio of a frequency divider for dividing signal from quartz oscillator 214 small, loop band width may be made high by lowering the frequency dividing as a loop. However, this results in a coarse stepping in station tuning and dislocation in a receiving channel selection. The dislocation may be corrected to a minimum and a higher loop band width may be implemented maintaining a desired tuning by varying the dividing ratio of frequency divider 215 for about 10–20% depending on a channel.

The relationship is represented in (Formula 1), where local oscillation frequency is Fvco, 64/65 2-modulus type main counter is N, swallow counter is A, reference signal frequency is Xtal, dividing ratio of reference frequency divider is R:

Formula 1

$$Fvco=(64*N+A)*(Xtal/R)$$

Suppose; Fvco=1800 MHz, Xtal=16 MHz, R=32, then (N, A)=(56, 16). When, even if A is stepped up, it is variable only by 16/32=0.5 MHz step. However, if R=33, (N, A)=(58, 1), then it turns to (Formula 2), making a fine tuning by 0.24 MHz step possible. Thus fine tuning is implemented while maintaining the characteristic of high loop band width.

Formula 2

$$Fvco=(64*58+1)*(16/33)=1800.24$$

The higher the output frequency of voltage controlled oscillator 208, the lower the frequency control sensitivity of voltage controlled oscillator 208. As a result, the phase noise improvement effect due to the high loop band width is diminished in the vicinity of output frequency. Therefore, the phase noise is improved by making the loop band width high, through a setting where the dividing ratio of reference frequency divider goes smaller with the increasing output frequency.

As an example, in a case where the low frequency Fvco1=1488 MHz and the high frequency Fvco2=2500 MHz, calculations by using (Formula 1) with dividing ratios of reference frequency divider R1=45 and R2=32 yield (Formula 3) and (Formula 4), respectively.

Formula 3

$$1488=(64*65+25)*(16/45)$$

Formula 4

$$2500=(64*78+8)*(16/32)$$

The output frequency is set through the above described formulae. Namely, the high loop band width has been implemented by setting reference frequency at, for the case of low frequency, Fvco1 16/45=0.35 MHz, for the case of high frequency, Fvco2 16/32=0.5 MHz.

Next, variable attenuators 204, 220 will be described. In FIG. 10 and FIG. 13, an AGC 226 delivers control voltage to both of the variable attenuators 204 and 220. The variable attenuator 204 in the fore stage varies the input level for controlling the mixed modulation arising at a mixer 206 with multiple signals of strong electric fields. The total gain is controlled by the variable attenuator 220, the operational range of which being larger than 50 dB. A wide input range is thus implemented.

Embodiment 7

Figure 17:
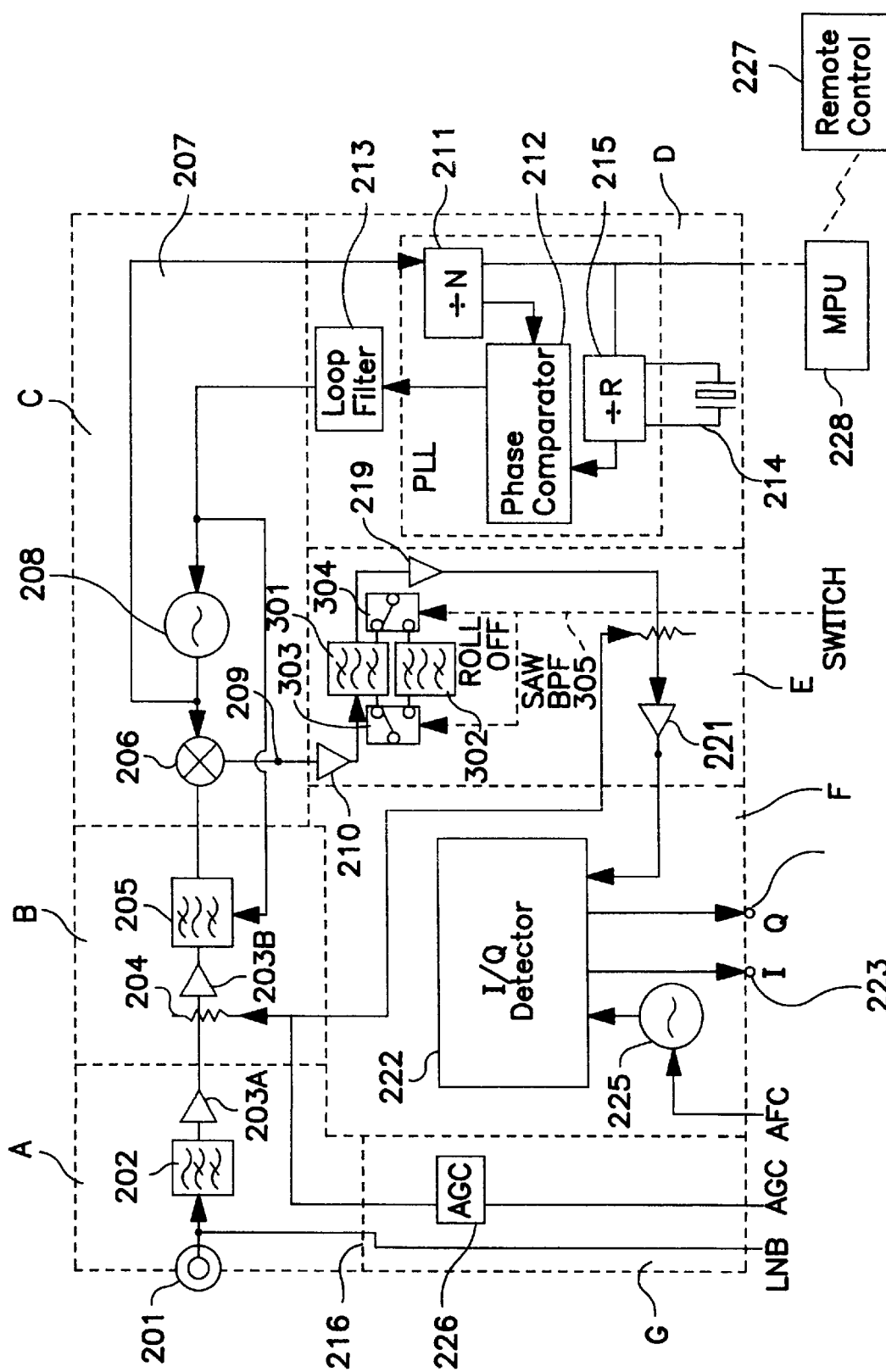
FIG. 17 is a block diagram of high frequency apparatus according to Embodiment 7 of the present invention.

An intermediate frequency tuning filter having roll-off characteristic is described in the following. FIG. 17 shows other example of block E of FIG. 10 and FIG. 13. Numerals 303, 304 denote switches, and 301, 302 intermediate frequency tuning filters each having roll-off characteristic and different band width. The switches 303 and 304 are operated interlocked by a switching signal 305 from outside, allowing an intermediate frequency signal to go selectively through the intermediate frequency tuning filter 301 or 302. Thus high frequency signals are received in an optimum state even if the band width of the signals differs due to different transmission rate.

Embodiment 8

Figure 18:
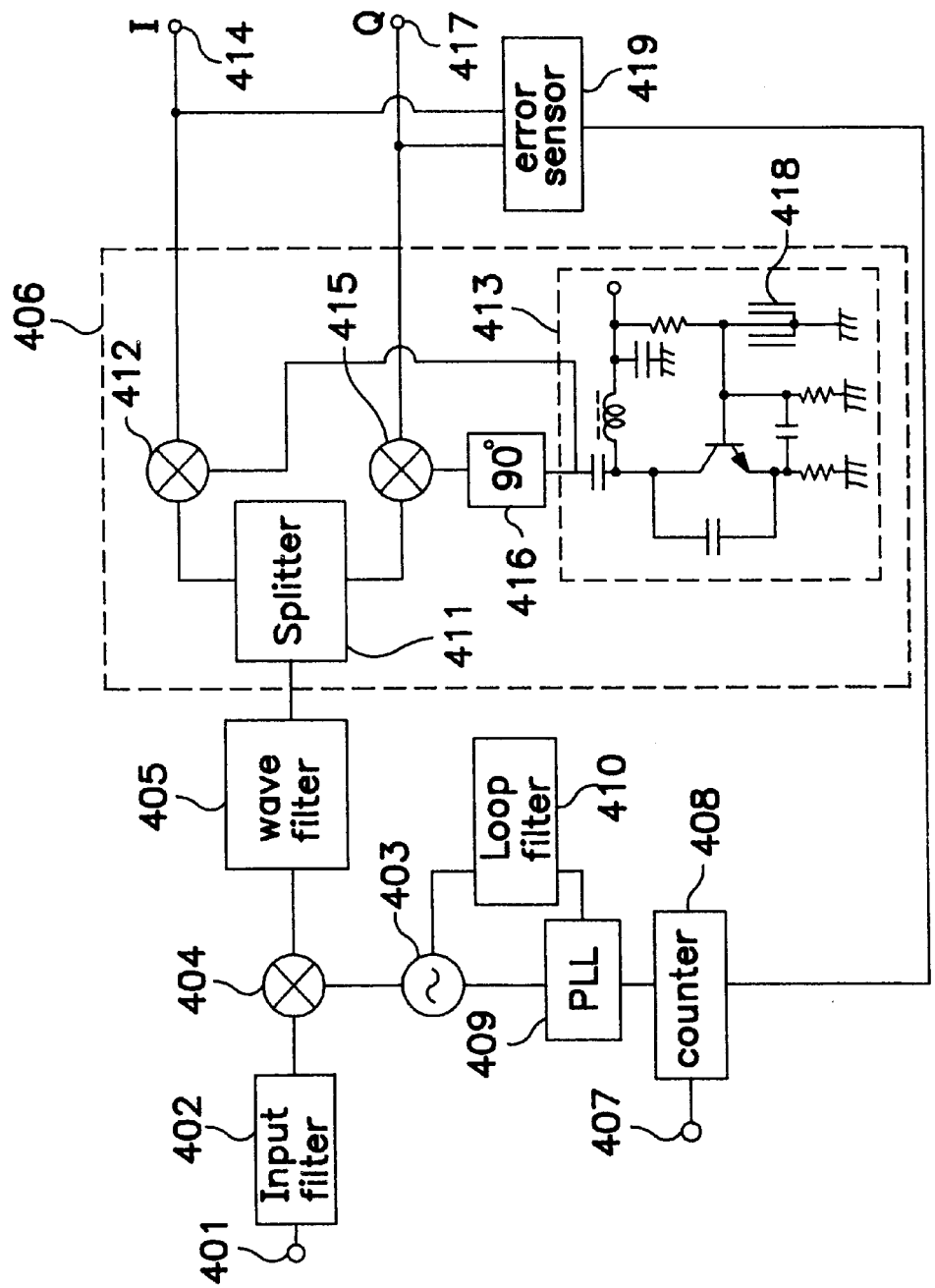
FIG. 18 is a block diagram of high frequency apparatus according to Embodiment 8 of the present invention.

An exemplary embodiment 8 of the present invention is described in the following. Referring to FIG. 18, a high frequency apparatus according to the present invention comprises an input terminal 401 for receiving high frequency digital signals, an input filter 402 connected to the input terminal 401, a mixer 404 which receives the output of input filter 402 at one input and one output of a first oscillator 403 at the other input, an intermediate frequency tuning surface acoustic wave filter 405 to which the output of mixer 404 is delivered, an I/Q detector 406 to which the output of intermediate frequency tuning surface acoustic wave filter 405 is connected, a control data input terminal 407 for receiving frequency control data, a PLL 409 connected to the control data input terminal 407 via an adding/subtracting counter 408, the PLL 409 being connected to the other output of said first oscillator 403, and a loop filter 410(hereinafter referred to as low-pass filter) connected between output of the PLL 409 and input of said first oscillator 403.

Said I/Q detector 406 is connected to a splitter 411 which is connected to output of said intermediate frequency tuning surface acoustic wave filter 405, a first detector 412 which is connected to one output of the splitter 411 at one input, to the other input of first detector 412 output of a second oscillator 413 is connected, and the output of first detector 412, or I signal output, is delivered to a first output terminal 414.

A second detector 415 coupled with other output of said splitter 411 at one input is connected to a quadrature splitter 416 at the other input, and the second oscillator 413 is connected to the input of quadrature splitter 416.

The Q signal output of said second detector 415 is connected to a second output terminal 417. The second oscillator 413 is comprised of a resonance element employing a surface acoustic wave resonator 418, a same material is being used for the substrate of said surface acoustic wave resonator 418 and the substrate of said intermediate frequency tuning surface acoustic wave filter 405. A frequency error sensor 419 to which the I signal output and the Q signal output are connected is connected to the adding/subtracting counter 408.

In the following, the operation of above described high frequency digital signal receiver is described. The oscillation frequency of first oscillator 403 is determined by a control data first inputted to said control terminal 407. Intermediate frequency signal 456 obtained therefrom is shown in FIG. 19; the intermediate frequency signal 456 is centered at f0.

Due to change in external temperature etc., the center frequency f0 of intermediate frequency tuning surface acoustic wave filter 405 and the oscillation frequency f0 of said second oscillator shift together by about f0+a, because the substrate of the both items uses a same material. If the intermediate frequency signal stays in the same state as 456, symmetry between the base band signal 457 of I signal output and the base band signal 458 of Q signal output is corrupted as the center frequency of intermediate frequency tuning surface acoustic wave filter 405 shifts by about f0+a due to change of external temperature etc. Especially, the base band signal bandwidth of Q signal output becomes narrow, and detection error arises.

Figure 19D:
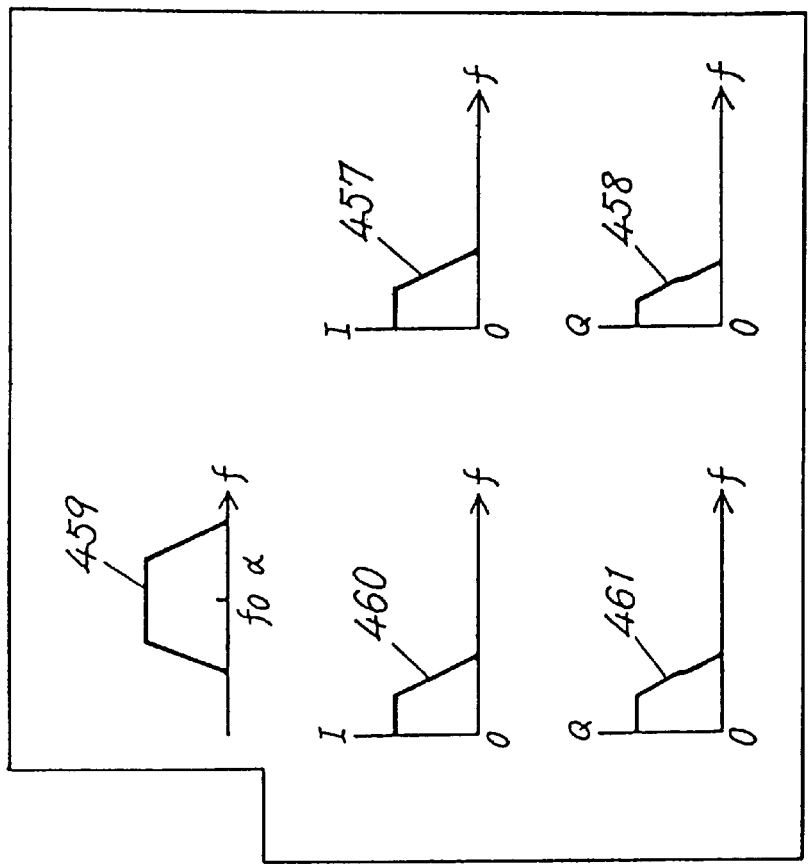
FIG. 19(d) are wave form charts showing key protions of wave forms in the high frequency apparatus of FIG. 18.
Figure 19A:
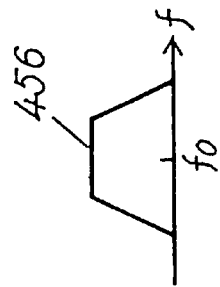
FIG. 19(a) is a IF signal
Figure 19B:
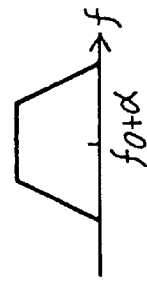
FIG. 19(b) is a frequency band characteristic of IF tuning surface acoustic wave filter.
Figure 19C:
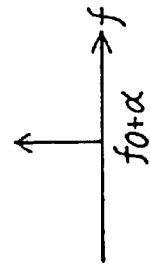
FIG. 19(c) is I/Q detector second oscillator.

Therefore, said first oscillator 403 is controlled according to the frequency error of base band signal by said adding/subtracting counter so as the intermediate frequency signal becomes f0+a, as indicated by numeral 459 in FIG. 19(d). As a result, the base band signal 460 of I signal output and the base band signal 461 of signal output are balanced, and no detection error arises.

In a case where the 3 dB cutoff frequency band width of intermediate frequency tuning surface acoustic wave filter 405 is made to be greater than −0% within +5% of the frequency band width which being equal to symbol rate of receiving signal, a roll-off filter may be eliminated; which otherwise was necessary at the subsequent stage of first output terminal 414 and second output terminal 417.

Namely, the intermediate frequency tuning surface acoustic wave filter 405 additionally functions as the roll-off filter.

Namely, the band width of a frequency 3 dB down the band width characteristic of intermediate frequency tuning surface acoustic wave filter 405 is made to be greater than −0% within +5% of the frequency band width which being equal to symbol rate of receiving signal. Then, the 3 dB cutoff frequency of the base band signal 460 of I signal output and the base band signal 461 of Q signal output respectively becomes greater than −0% within +5% of one half the band width of symbol rate.

Namely, the function of roll-off filter is implemented in the intermediate frequency tuning surface acoustic wave filter 405 at an accuracy greater than −0% within +5%. Therefore, there is no need of additionally providing a roll-off filter in the subsequent stage of first output terminal 414 and second output terminal 417. As there is no need of additionally providing a roll-off filter, the present exemplary embodiment helps present an inexpensive high frequency apparatus.

Embodiment 9

Figure 20:
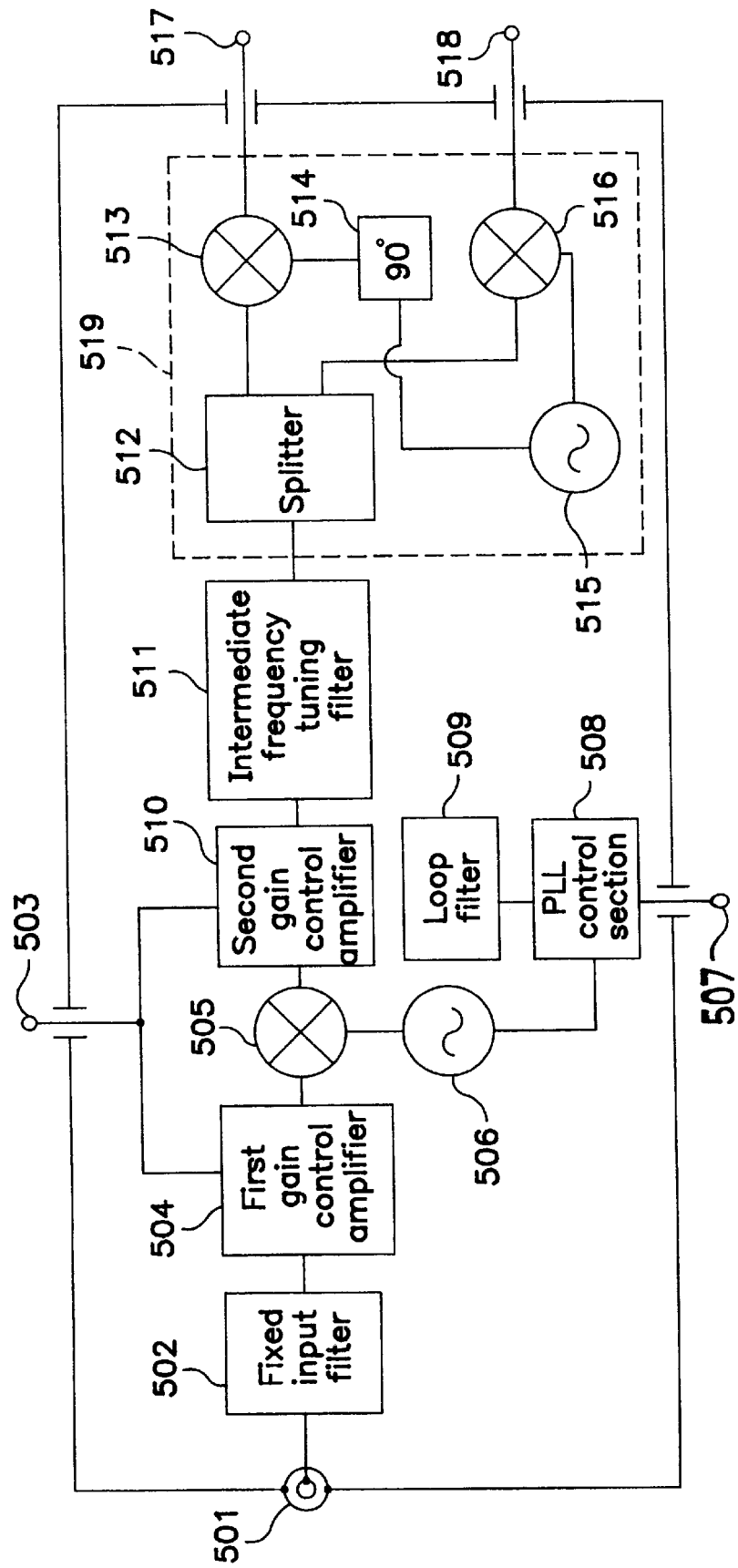
FIG. 20 is a block diagram of high frequency apparatus according to Embodiment 9 of the present invention.

An exemplary embodiment 9 of the present invention is described in the following. FIG. 20 is a block diagram showing an exemplary embodiment 9 of the present invention.

In FIG. 20, numeral 501 denotes an input terminal, 502 is a fixed input filter connected to the input terminal 501, 504 is a first gain control amplifier connected to output of the fixed input filter 502, 503 is a gain control terminal connected to the gain control input of first gain control amplifier 504, 505 is a mixer connected to output of said first gain control amplifier 504 at one input, 506 is a first oscillator one output of which is delivered to the other input of mixer 505, 508 is a PLL control section connected to the other output of first oscillator 506, 509 is a loop filter(hereinafter referred to as low-pass filter) connected between the output of PLL control section 508 and the input of said first oscillator 506, 507 is a control terminal connected to the frequency data input terminal of said PLL control section 508, 510 is a second gain control amplifier connected to the output of said mixer 505, 511 is an intermediate frequency tuning filter connected to the output of second gain control amplifier 510, the gain control input of second gain control amplifier 510 being connected to said gain control terminal 503, 519 is an I/Q detector connected to the output of intermediate frequency tuning filter 511, 517 is a first output terminal connected to the Q signal output of I/Q detector 519, and 518 is a second output terminal connected to the I signal output of said I/Q detector 519.

The I/Q detector 519 comprises a splitter 512 connected to the output of said intermediate frequency tuning surface acoustic wave filter 511, a first detector 513 connected to one output of the splitter 512 at one input, a quadrature splitter 514 connected to the other input of first detector 513, a second oscillator 515 connected to the input of quadrature splitter 514, and a second detector 516 connected to the other output of said splitter 512 at one input, the other input of second detector 516 being connected to said second oscillator 515 and the output delivered to a second output terminal 518.

The output of said first detector 513 is connected to first output terminal 517. The frequency of said first oscillator 506 is determined so that an intermediate frequency to be inputted to said tuning filter 511 is greater than one half the difference between the largest frequency and the smallest frequency of signals inputted to said input terminal 501.

The operation of the above described high frequency apparatus is described in the following. Suppose intermediate frequency is represented as IF, the largest frequency to be inputted to said input terminal as RFmax and the smallest frequency as RFmin, and the image disturbing frequency of upper heterodyne system as Im. If Im>RFmax, then image disturbing frequency is not supplied to input terminal 501 of a high frequency apparatus.

Meanwhile, Im=RF+2*IF, therefore a frequency at the smallest Im frequency is RFmin+2*IF. Namely, RFmin+2*IF>RFmax. This formula is modified to $$IF>(RFmax-RFmin)/2$$

Therefore, if first oscillator 506 is controlled in its oscillation frequency so as an intermediate frequency IF is larger than one half the difference between the largest frequency RFmax and the smallest frequency RFmin to be inputted to said input terminal 501, an image disturbing frequency IF, even if it is inputted to said input terminal 501, is not allowed by said fixed input filter 502 to go through said intermediate frequency tuning filter 511 because the frequency is greater than RFmax.

In the present exemplary embodiment, RFmax=550 MHz, RFmin=50 MHz. By determining an intermediate frequency IF to be greater than (550–50)/2=250 MHz, an image disturbing frequency Im, even if it is inputted to said input terminal 501, is blocked by said fixed input filter 502, therefore not delivered from said intermediate frequency tuning filter 511.

Presently, in many of CATV down signals the 612 MHz band is a vacant channel not used for signal transmission. Therefore, in an example of the present embodiment, said 612 MHz band has been determined as intermediate frequency of high frequency apparatus.

In other exemplary embodiment, in case where there is a direct disturbance to the 612 MHz band a 612 MHz band attenuation trap is added to said fixed input filter 502 for preventing the disturbance.

As described above, a filter for removing an image disturbing frequency Im has been eleiminated by managing to obtain an intermediate frequency IF greater than one half the difference between the largest frequency RFmax and the smallest frequency RFmin of signals inputted to input terminal 501. Namely, a simple fixed input filter 502 which allows only the frequency inputted in said input terminal 501(RFmax–RFmin) to pass through is enough. As said fixed input filter 502 does not allow the frequency smaller than the smallest frequency RFmin to pass through, there is no possibility of disturbance to be caused from a CATV up signal. A high frequency apparatus is thus implemented with a simple control system. Further, in the present high frequency apparatus, a lock disturbance is avoidable by housing a high frequency apparatus of embodiment 5 within one shield case.

Embodiment 10

Figure 21:
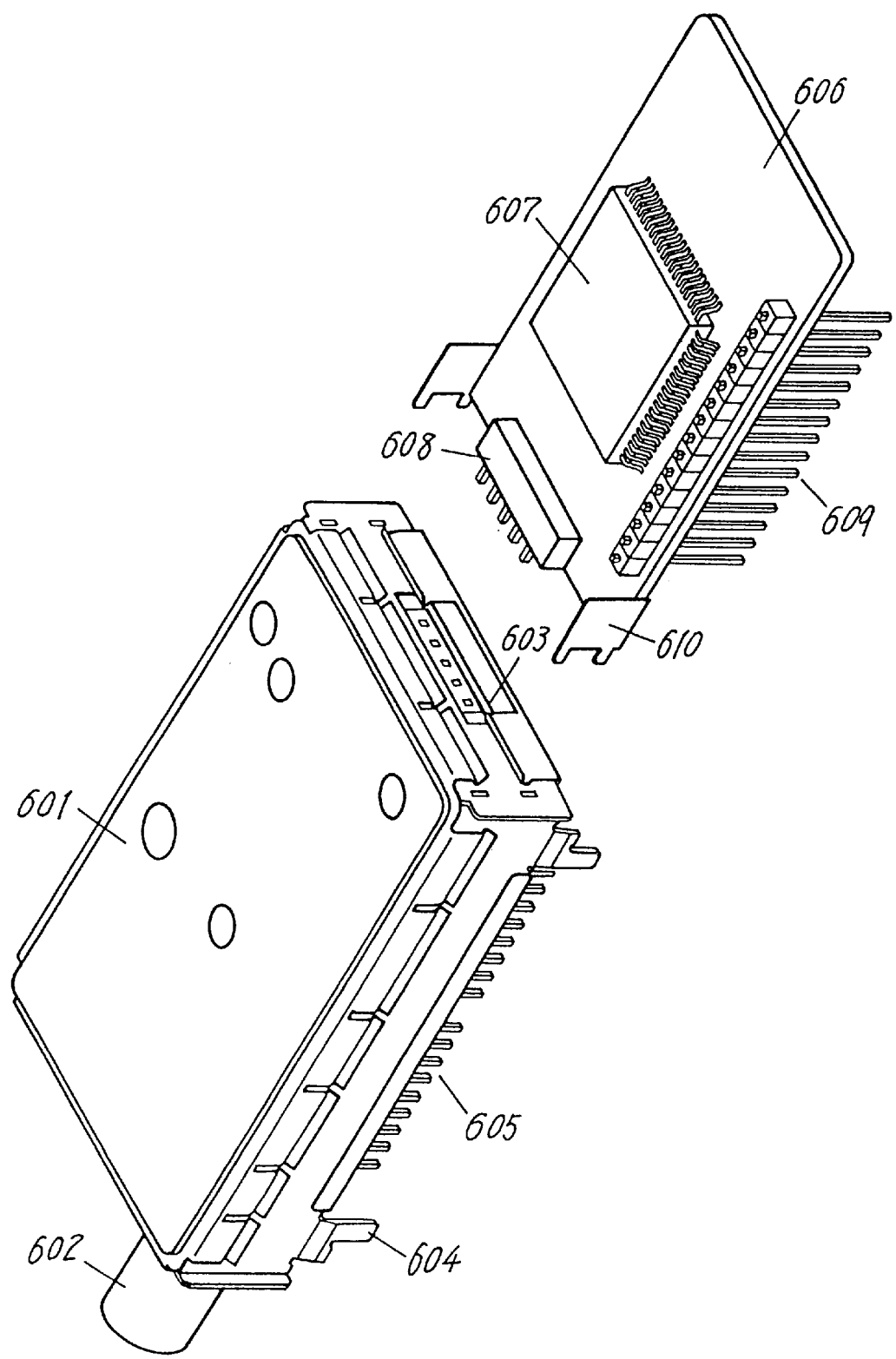
FIG. 21 is a perspective view showing a first exemplary high frequency apparatus according to Embodiment 10 of the present invention.

In FIG. 21, numeral 601 denotes a rectangular metal case, which is so-called a tuner section. In one side of the metal case 601, an input terminal 602 is provided, while in the other side an output terminal 603 is provided. Inside the metal case 601, a mixer which receives the input signal inputted to said input terminal 602 at one input and an output of local oscillator at the other input, and an I/Q extracting means provided between the mixer and said output terminal 603 are mounted. Numeral 604 is a foot for mounting the case 601 on a mother substrate, 605 a group of input/output terminals provided in the length direction on a plane having the largest area in case 601, which terminals being connected to mixer, local oscillator, I/Q extracting means etc.

The I/Q extracting means is a concept which contains at least either one of I/Q detector and A/D converter.

Numeral 606 is a substrate, on the surface of which a demodulator 607 forming a demodulating section constituted by integrated circuits is mounted. Input of the demodulator 607 is connected to an input terminal 608 of substrate 606, which input terminal 608 is connected to said output terminal 603 with a connector. Numeral 609 denotes a group of input/output terminals connected to the deomodulator 607, provided on sustrate 606 in the length direction.

Numeral 610 denotes a connecting portion provided on the substrate 606 at the same side as the input terminal 608. The substrate is connected with said metal case 601 in the side of output terminal 603 by means of the connecting portion 610. The substrate 606 is not covered by any case, but the demodulator 607 mounted on the substrate 606 is exposed direct to the outside air. This is a consideration for dissipating the heat generated by the demodulator 607, whose electric power consumption is as much as approximately 2 W.

Figure 22:
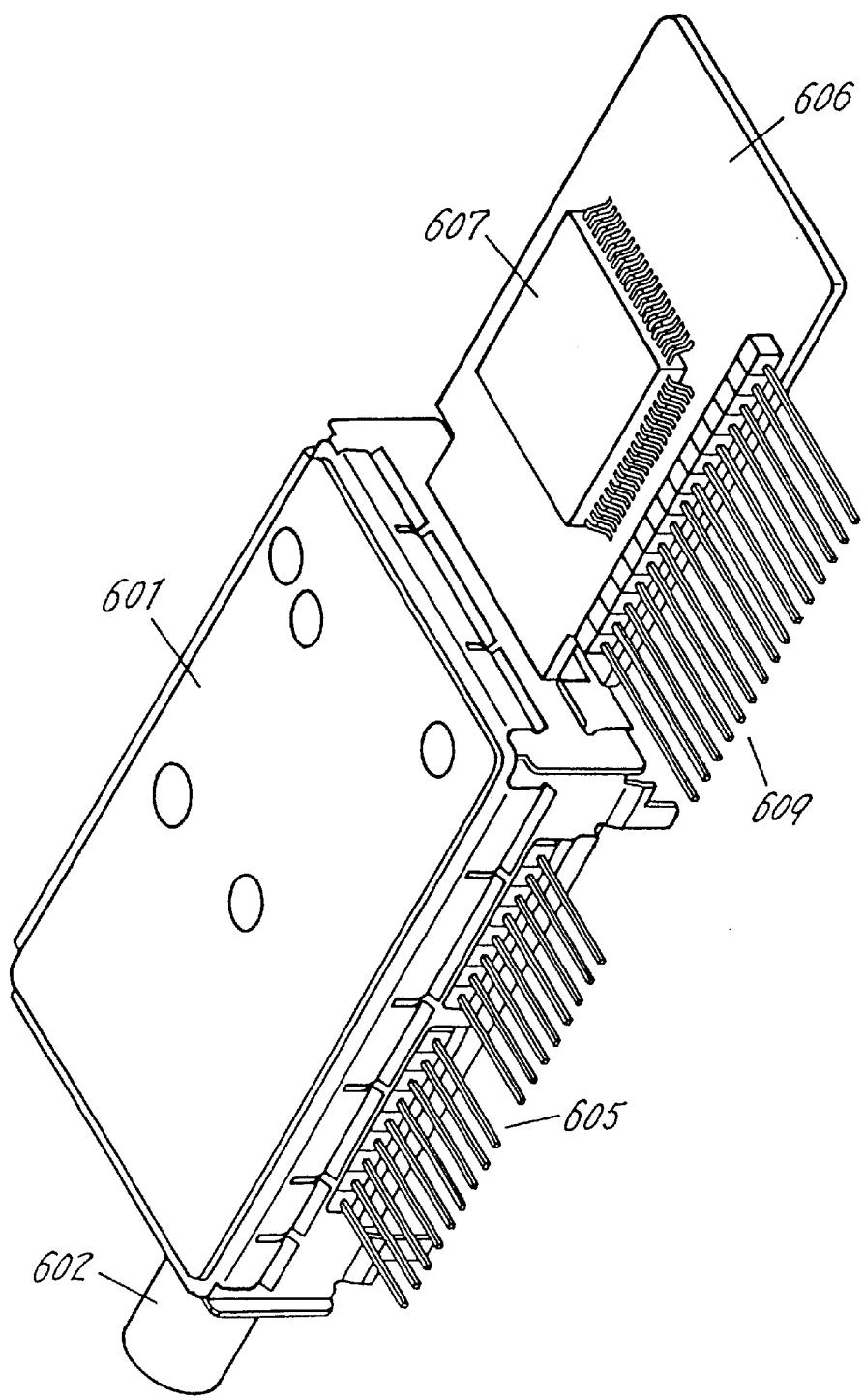
FIG. 22 is a perspective view of a second exemplary high frequency apparatus of FIG. 21.
Figure 23:
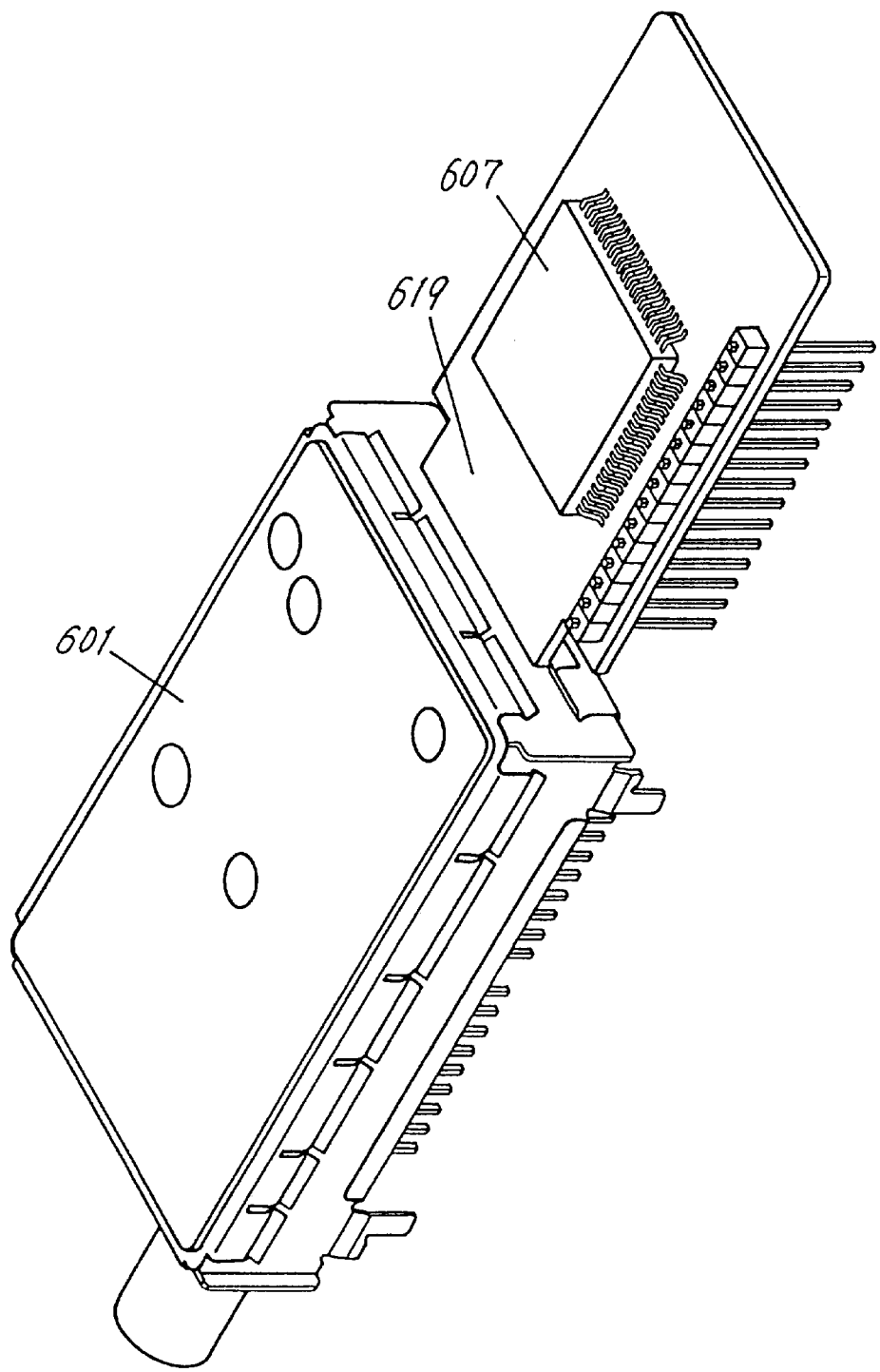
FIG. 23 is a perspective view of a third exemplary high frequency apparatus of FIG. 21.

In the present exemplary embodiment, the groups of input terminals 605, 609 are disposed on a plane of largest area enabling a so-called flat-lying mounting on mother substrate. This helps making the mother substrate thinner and presenting a flat shaped apparatus. It is also possible to provide the groups of input/output terminals 605, 609 on a length side plane next to said largest area plane, as shown in FIG. 22. This enables a so-called vertical mounting, which helps reducing the mounting area of mother substrate.

Furthermore, the substrate in case 601 and the substrate 619 on which a demodulator 607 is mounted may be constituted on a single substrate.

Figure 24:
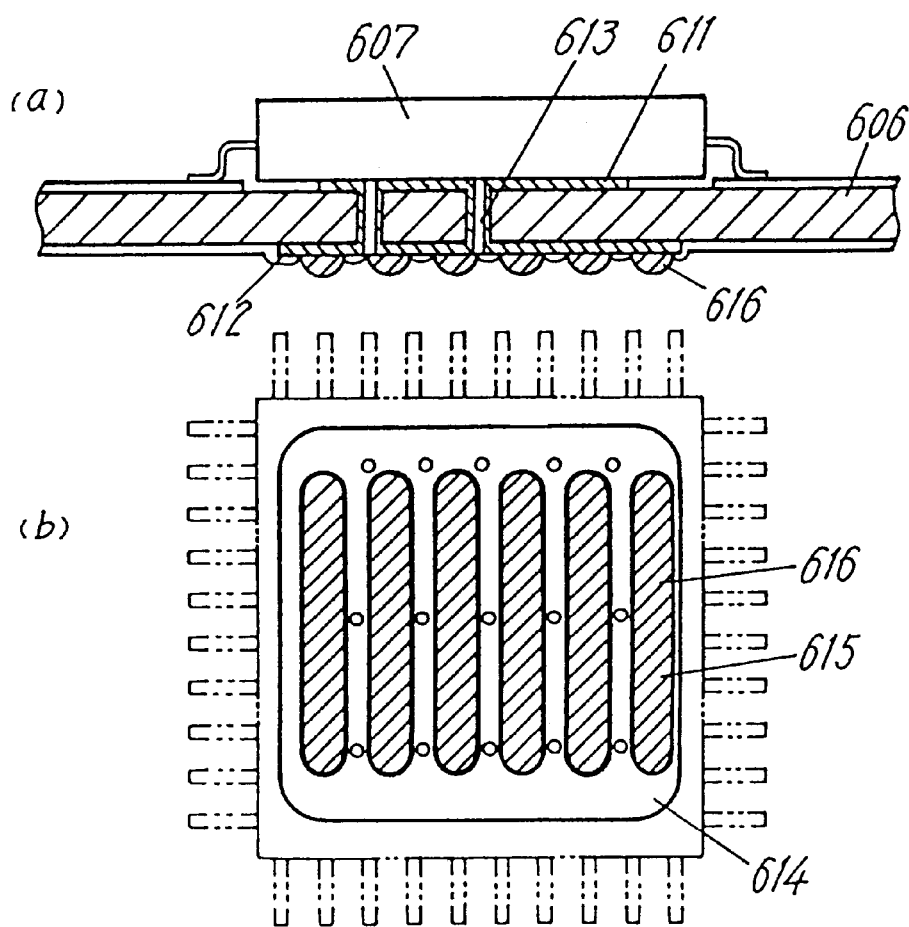
FIG. 24(a) is a cross sectional view showing key part of demodulator of the high frequency apparatus of FIG. 21.
FIG. 24(b) is a plane view showing a key part of the demodulator as viewed from the back surface of substrate.

FIG. 24(*a*) is a cross sectional view showing key part of substrate 606 on which a demodulator 607 is mounted. On the top surface of substrate 606 a copper foil 611 is laid in an area underneath the demodulator 607, the bottom surface of said demodulator 607 being in contact with the copper foil 611. Also on the back surface of substrate 606 a copper foil 612 is provided which is connected with said copper foil 611 by means of a plurality of through holes 613. With the above structure, the heat generated at demodulator 607 is conducted to copper foil 611, and then via through hole 613 to copper foil 612 on the back surface of substrate 606 to be dissipated there.

FIG. 24(*b*) is a plane view showing key part of the substrate 606 as viewed from the bottom. In FIG. 24(*b*), a solder resist 614 is printed on the copper foil 612 providing a plurality of strip-shaped void patterns 615. On the void patterns 615, solder 616 is provided protruded by soldering process, for making the heat dissipation more efficient. Said through hole 613 is disposed in the solder resist print 614. The reason why the through holes 613 are disposed on the solder resist print 614 is for avoiding short circuit etc. which might be caused by the solder 616 immersing to side of demodulator 607. The width of solder resist prints 614 between the plurality of solders 616 is made to be approximately identical; in the present exemplary embodiment the width is 1 mm. The diameter of through holes is 0.5 mm, and 15 such holes are provided concentrated beneath the demodulator 607.

Figure 25:
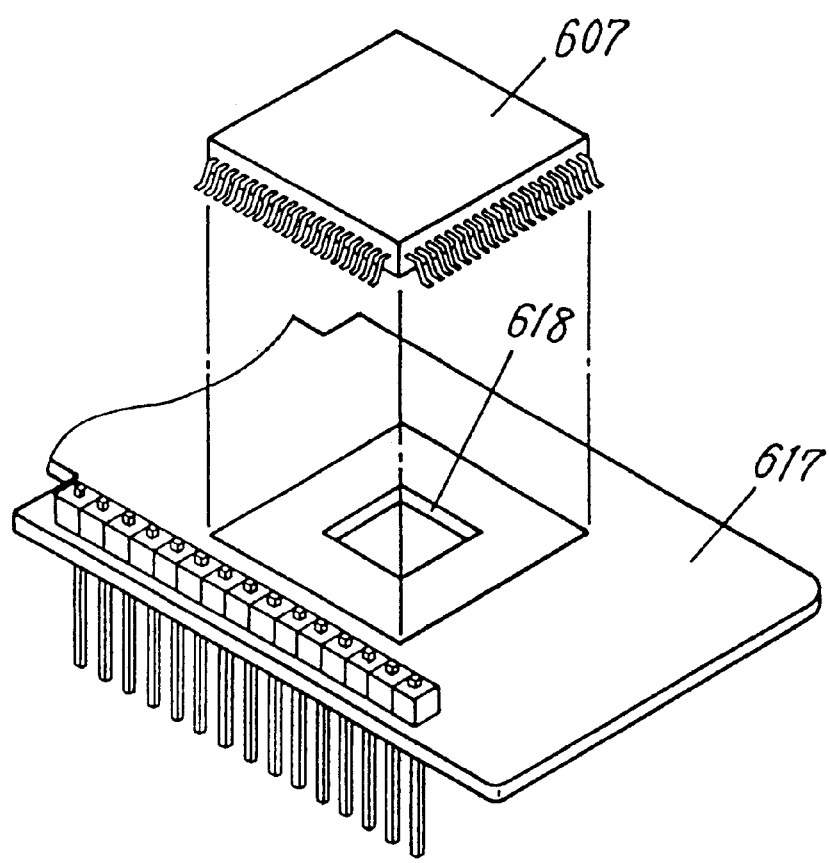
FIG. 25 is a perspective view showing a second exemplary demodulator in the high frequency apparatus of FIG. 21.

FIG. 25 shows a substrate 617 for mounting a demodulator 607, in which substrate a hole 618 is provided under said demodulator 607, instead of providing the above described through holes. The size of hole 618 being larger than chip size and smaller than the overall dimensions of demodulator 607. The hole 618 may either be square or round; in view of heat dissipation it should be a largest possible within a limitation that it should be smaller by 0.5 mm than the outer dimensions of demodulator 607. The 0.5 mm is a safety margin to allow some dislocation when mounting a demodulator 607.

Figure 26:
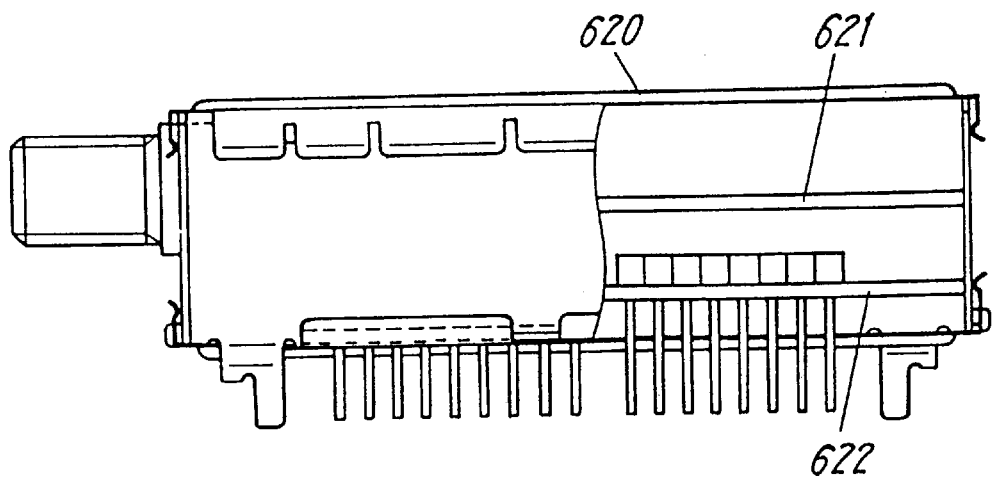
FIG. 26 is a partially broken side view of a fourth exemplary high frequency apparatus of FIG. 21.

In FIG. 26, a first substrate 621 and a second substrate 622 are disposed in parallel arrangement within a case 620 for housing a high frequency apparatus; first substrate 621 being mounted with a tuner section, while second substrate 622 with a demodulating section. With the above described mounting arrangement, tuner section and demodulating section may be disposed in most appropriate mounting places with a shortest connection distance. This contributes to make a high frequency apparatus smaller.

Embodiment 11

Figure 27:
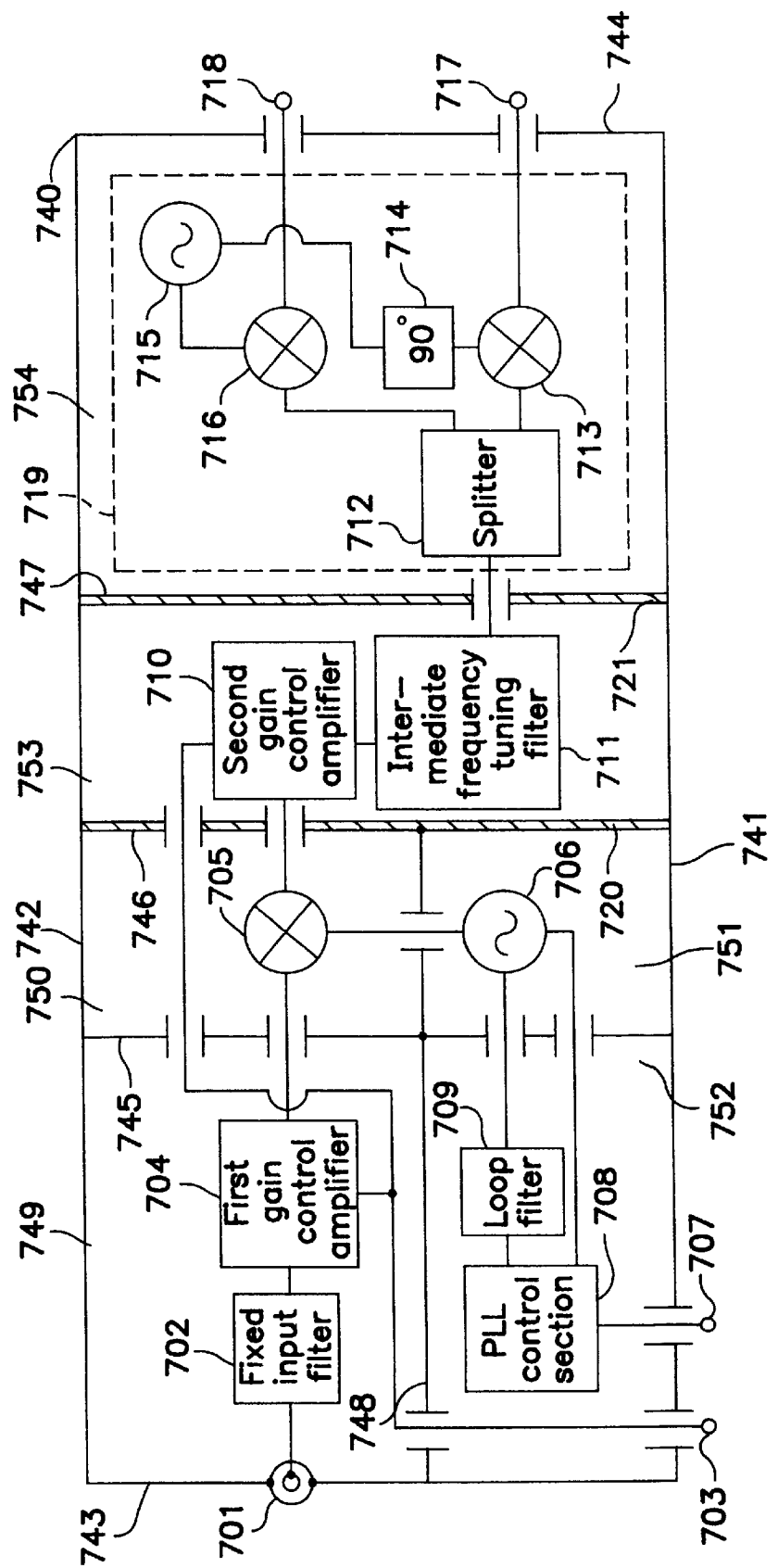
FIG. 27 is a block diagram of high frequency apparatus according to Embodiment 11 of the present invention.

FIG. 27 is a block diagram showing layout of respective blocks of a high frequency apparatus according to an exemplary embodiment 11 of the present invention.

In FIG. 27, numeral 701 denotes an input terminal, 702 is a fixed input filter connected to the input terminal 701, 704 is a first gain control amplifier connected to the output side of fixed input filter 702, 703 is a gain control terminal connected to the gain control input of first gain control amplifier 704, 705 is a mixer connected to the output of said first gain control amplifier 704 at one input, 706 is a first oscillator connected to the other input of mixer 705 at one input, 708 is a PLL control section connected to the other output of first oscillator 706, 709 is a loop filter(hereinafter referred to as low-pass filter) connected between the output of PLL control section 708 and the input of said first oscillator 706, 707 is a control terminal connected to the frequency data input terminal of said PLL control section 708, 710 is a second gain control amplifier connected to the output of said mixer 705, the gain control input of second gain control amplifier 710 being connected to said gain control terminal 703, 711 is an intermediate frequency tuning filter connected to the output of second gain control amplifier 710, 719 is an I/Q detector connected to the output of intermediate frequency tuning filter 711, 717 is a first output terminal connected to the Q signal output of I/Q detector 719, and 718 is a second output terminal connected to the I signal output of said I/Q detector 719.

The I/Q detector 719 is comprised of a splitter 712 connected to the output of said intermediate frequency tuning filter 711, a first detector 713 connected to one output of the splitter 712 at one input, a quadrature splitter 714 connected to the other input of first detector 713, a second oscillator 715 connected to the input of quadrature splitter 714, and a second detector 716 connected to the other output of said splitter 712 at one input, the other input of second detector 716 being connected to said second oscillator 715, and the output connected to an output terminal 718. The output of said first detector 713 being connected to a first output terminal 717. These components are housed in a shield case 740.

Disposition of respective components housed in the metal shield case 740 is described in the following. The shield case 740 is comprised of a first lengthwise side board 741, a second lengthwise side board 742 provided in parallel with the first lengthwise side board 741, a first widthwise side board 743 and a second widthwise side board 744 both provided perpendicular to the lengthwise side boards 741, 742, and takes shape of a parallelogram. Metal separating plates are provided in parallel with the widthwise side boards 743, 744; in the order from the first widthwise side board 743, a first separating plate 745, a second separating plate 746 and a third separating plate 747.

A fourth separating plate 748 is provided in parallel with the lengthwise side board 741, from the first widthwise side board 743, through the first separating plate 745, reaching the second separating plate 746, forming compartments.

In a compartment 749 formed by separating plate 745, separating plate 748 and lengthwise side board 742, the input terminal 710 positioned on the widthwise side board 743, the fixed input filter 702 and the first gain control amplifier 704 are disposed. In a compartment 750 formed by separating plate 745, separating plate 746, separating plate 748 and lengthwise side board 742, the mixer 705 is mounted. In a compartment 751 formed by separating plate 745, separating plate 746 and lengthwise side board 741, the oscillator 706 is mounted. In a compartment 752 formed by separating plate 748, separating plate 745 and lengthwise side board 741, the PLL control section 708, the low pass filter 709 are mounted, and the gain control terminal 703 and the control terminal 707 are attached on the lengthwise side board 741. In a compartment 753 formed by separating plate 746 and separating plate 747, the second gain control amplifier 710 is mounted in the side of lengthwise side board 742, and the intermediate frequency tuning filter 711 in the side of lengthwise side board 741.

In a compartment 754 formed by separating plate 747, lengthwise side boards 741, 742 and widthwise side board 744, the I/Q detector 719 is mounted, and the first output terminal 717 and the second output terminal 718 are attached on the widthwise side board 744. The above described disposition is for keeping the symmetry of I/Q detection output, by making a length from the first detector 713 to the first output terminal 717 and that from the second detector 716 to the second output terminal 718 identical to each other.

The first output terminal 717 and the second output terminal 718 may be disposed on the lengthwise side board 741, on condition that the symmetry of I/Q detection output is maintained. In such a case, the shield case 740 may be attached on mother substrate with the lengthwise side board 741 down; this arrangement will offer a convenience in wiring, as the signals come to the mother substrate side disposed towards a same direction. The gain control terminal 703 connected to second gain control amplifier 710 may be disposed on the lengthwise side board 741 in compartment 753. In such a case, although the gain control terminal 703 increases in number it will not pick up noise in compartment 749 and compartment 750. The shield case 740 may be attached to mother substrate in a flat lying model; which improves the anti-vibration property. So, when a high frequency apparatus is requested to be especially stable against vibration, it is preferred to attach the shield case to mother substrate in a flat lying model.

In any way, what is important is to categorize the constituent components according to the handling frequency or the function, and divide them into groups to be housed in respective compartments, as was done in the present exemplary embodiment. Depending on requirements, it is preferred to make the separating plates 746 and 747, among others, double-structured for complete separation.

Now in the following, function of respective compartments as well as the frequency will be described. The compartment 749 houses 50 MHz–550 MHz input signal filter 702 and first gain control amplifier 704; these have to be kept free from disturbance signals from outside. The compartment 750 is a mixer for converting input signal into 612 MHz band intermediate frequency; it is important to keep the signal not to leak out. The reason why the intermediate frequency is determined to 612 MHz band has been described in detail in embodiment 9 above. The compartment 751 handles variable frequency of approximately 662 MHz–1162 MHz; it is important to keep the signal not to leak out.

The compartment 752 handles digital signal for channel selection; it is important to keep the signal not leak out or leaking into compartment 749. The compartment 753 is a place to amplify with high accuracy the intermediate frequency, 612 MHz band; intrusion of external disturbing signal into the compartment has to be restricted as small as possible. Namely, the separating plate 746 and the separating plate 747 need to be installed surely with a higher care. The compartment 754 houses I/Q detector which handles from the 612 MHz band through the detection output signal frequency band region; here, it is important to avoid intrusion of signal from outside and to conduct an error-free detection. Because of these compartments said first oscillator 706 and said second oscillator 715 are separated to each other by separating plate 746 and separating plate 747, and are disposed on a diagonal line. In the following, the operation of the above described high frequency apparatus will be set forth.

The 50 MHz–550 MHz high frequency digital signals inputted in input terminal 701 go through fixed input filter 702 to have unnecessary signals, being those other than 50 MHz–550 MHz, removed. After amplified by first gain control amplifier 704, the signals are mixed with a frequency delivered from oscillator 706 to produce the 612 MHz band intermediate frequency. The intermediate frequency is amplified at second gain control amplifier 710, and filtered at intermediate frequency tuning filter 711 leaving only the 612 MHz band, or intermediate frequency. Then, after detected at I/Q detector 719, I signal output is delivered to second output terminal 718, Q signal output to first output terminal 717. These I signal output and Q signal output are then processed by a digital signal demodulator having digital clock.

In the present exemplary embodiment where a high frequency apparatus according to the present exemplary embodiment is housed in one shield case 740, the shielding effect of shield case 740 prevents the high frequency apparatus from being disturbed by the digital clock.

Other effect includes, that said first oscillator 706 and said second oscillator 715 are separated to each other by separating plate 746 and separating plate 747 and are disposed on a diagonal line for the purpose of decreasing the spurious disturbance due to mutual interference of said first oscillator 706 and said second oscillator 715, therefore the spurious disturbance due to mutual interference of said first oscillator 706 and said second oscillator 715 is decreased.

Further other effect includes, that the separation of compartment 752 eliminates possibility of a digital signal for channel selection disturbing other compartments.

Further other effect includes, that as a result of erection of compartment 753 said first oscillator 706 and said second oscillator 715 are separated to each other, the spurious disturbance due to mutual interference of said first oscillator 706 and said second oscillator 715 is decreased. Further other effect includes, that by disposing the first output terminal 717 and the second output terminal 718 on lengthwise side board 741 maintaining the symmetry of I/Q detection output as it is, and placing the shield case 740 on mother substrate with the lengthwise side board 741 down, the signals come to the mother substrate side in a same direction; which structure presents a convenience for wiring arrangement.

Industrial Applicability

As described above, a high frequency apparatus according to the present invention comprises an input terminal for receiving digital modulated high frequency signals, a mixer which receives signals inputted to the input terminal at one input and an output signal of local oscillator at the other input, and an output terminal for delivering output signal of the mixer, said local oscillator being comprised of a voltage controlled oscillator, a frequency divider intervening in the control loop of voltage controlled oscillator, a phase comparator, and a loop filter. Said voltage controlled oscillator being comprised of an oscillation section and a tuning section. The tuning section comprises a frequency adjusting section and a means for maintaining a tuned state of the frequency adjusting section. Said control loop has a high loop band width great enough so as the noise of said local oscillator is not dominated by noise of said voltage controlled oscillator.

With the above described constitution, as there is a frequency adjusting section provided as the tuning section of voltage controlled oscillator the tuning adjustment is easy, and as a state of the frequency adjusting section after adjustment is maintained by a maintaining means the anti-vibration property and the stability of oscillation frequency are sufficiently assured for a long term. On the other hand, when the maintaining means is employed for ensuring anti-vibration property etc., a stray capacitance is formed due to the dielectric constant higher than the air, which causes an dielectric loss inviting a deteriorated oscillation characteristic. In the present invention, however, this issue has been solved by making the control loop of voltage controlled oscillator to have a sufficiently high loop band width so as the noise of local oscillator is not dominated by the noise of voltage controlled oscillator. Therefore, the deterioration of oscillation frequency is correctable for a broad frequency band. Thus the output signal of local oscillatior to be delivered to mixer is a clear one that is free from phase noise.

We claim:

1. A high frequency apparatus comprising an input terminal for inputting digital modulated high frequency signals, a mixer which receives at one input the signals imputted to input terminal and at the other input an output signal of local oscillator, and an output terminal to which the output signal of mixer is delivered;

said local oscillator being comprised of a voltage controlled oscillator, a frequency divider, a phase comparator and loop filter, the last three items disposed intervening in the control loop, said voltage controlled oscillator being comprised of an oscillating section and a tuning section, which tuning section being comprised of a frequency adjusting section and a means for maintaining a state of the frequency adjusting section after adjustment; wherein said control loop has a loop band width so that the noise of said local oscillator is not dominated by the noise of said voltage controlled oscillator, and the signal level of the reference frequency signal supplied to said phase comparator is made to be smaller, relative to a comparative signal supplied from the frequency divider to the comparator, in a respective frequency excluding a portion substantially at the center of the frequency.

2. The high frequency apparatus of claim 1, wherein the frequency adjusting section comprises a movable conductive member provided on a substrate, and a fix member is employed as the means for maintaining said movable conductive member fixed.

3. The high frequency apparatus of claim 1, wherein a pattern inductance line is employed as the inductance element of tuning section, a movable conductive member is disposed at the vicinity of pattern inductance line, an adjustment is conducted using the movable conductive member, and the movable conductive member is fixed, after adjusted, with a fix member employed as the maintaining means.

4. The high frequency apparatus of claim 3, wherein the movable conductive member is disposed approximately in parallel with the pattern inductance line above the width centre of the pattern inductance line.

5. The high frequency apparatus of claim 3, wherein the movable conductive member is disposed in the vicinity of an open end of the pattern inductance line.

6. The high frequency apparatus of claim 1, wherein a coreless coil or a flat type transmission line is provided as the inductance element of tuning section, the coreless coil or the flat type transmission line is adjusted, and then said coreless coil or flat type transmission line is fixed with a fix member employed as the maintaining means.

7. The high frequency apparatus of claim 1, wherein the frequency adjusting section is comprised of outer surface of a core employed as the maintaining means and a conductor wound around said core.

8. The high frequency apparatus of claim 1, wherein the inductance element of tuning section is comprised of a cylindrical insulator, a conductor wound around the outer surface of said cylindrical insulator, a female screw provided in the inner wall surface of said cylindrical insulator and a movable core the outer surface of which is provided with a male screw matching the female screw.

9. The high frequency apparatus of claim 1, wherein the inductance element of tuning section is formed by a pattern inductance line and a movable conductive member connected together in series at each respective end, said movable conductive member is adjusted, a fix member is employed as the maintaining means, and said movable conductive member is fixed by said fix member.

10. The high frequency apparatus of claim 1, wherein a pattern inductance line is used as the inductance element of tuning section, an adjusting portion of the pattern inductance line undergoes trimming for adjustment, and the trimmed part is covered with a covering material.

11. The high frequency apparatus of claim 10, wherein a pattern inductance line and a movable conductive member are connected together in series at each respective end, the movable conductive member is adjusted, a fix member is employed as the maintaining means, and said movable conductive member is fixed by said fix member.

12. The high frequency apparatus of claim 1, wherein the local oscillator and the mixer are housed respectively in metal case, and a pattern inductance line laid on substrate as a part of the tuning section of said local oscillator is provided in the vicinity of said case or a metal separating plate.

13. The high frequency apparatus of claim 1, wherein a film capacitor is used as the capacitance of loop filter.

14. The high frequency apparatus of claim 13, wherein the film capacitor is mounted on the surface of substrate, a lead wire of said film capacitor being inserted in a through hole provided in said substrate, said lead wire is soldered to a conductive pattern in the back surface of substrate, while there is no electrode formed inside said through hole.

15. The high frequency apparatus of claim 13, wherein the loop filter and the local oscillator are separated to each other by a separating plate, the separating plate being provided with an opening for allowing a conductive pattern connecting said loop filter and said local oscillator to go through, and said film capacitor is mounted at the vicinity of the opening in a manner to cover the opening.

16. The high frequency apparatus of claim 1, wherein the loop filter is comprised of two stage transistors.

17. The high frequency apparatus of claim 1, wherein a movable conductive member is provided in the tuning section, said movable conductive member, a varactor diode and a pattern inductance line are connected together in series in the order, and said pattern inductance line is connected to the oscillating section.

18. The high frequency apparatus of claim 1, wherein the tuning section is comprised of a varactor diode and a pattern inductance line, said varactor diode and pattern inductance line being connected together in series with a small capacitance chip capacitor in between, and said small capacitance chip capacitor is mounted in the vicinity of said pattern inductance line.

19. The high frequency apparatus of claim 18, wherein a small capacitance chip capacitor is provided as a first capacitor between the varactor diode and the inductance, and a second capacitor is provided between said varactor diode and oscillating section, said first capacitor and said second capacitor being temperature compensating capacitors.

20. The high frequency apparatus of claim 1 further comprising a reference frequency divider in connection to the phase comparator, to which phase comparator a reference frequency signal is inputted, the dividing ratio of the reference frequency divider being variable.

21. The high frequency apparatus of claim 20, wherein the dividing ratio of reference frequency divider is made to go smaller along with the increasing output frequency of voltage controlled oscillator.

22. The high frequency apparatus of claim 1 further comprising a plurality of parallel-connected intermediate frequency tuning filters each having roll-off characteristic and different band width, wherein any one of the intermediate frequency tuning filters is selectively switched based on the transmission rate of signal inputted to the input terminal.

23. The high frequency apparatus of claim 1 further comprising a variable attenuator between the input terminal and the mixer, and a control terminal for controlling the variable attenuator.

24. The high frequency apparatus of claim 1 further comprising an I/Q detector connected to the output terminal via an intermediate frequency tuning surface acoustic wave filter, a first output terminal to which the I signal of I/Q detector is delivered, a second output terminal to which the Q signal of said I/Q detector is delivered, and a second oscillator for supplying oscillation frequency signal to said I/Q detector; wherein said second oscillator comprises resonating section, the substrate of surface acoustic wave resonator of said resonating section and the substrate of said intermediate frequency tuning surface acoustic wave filter being made of a same material, and a frequency error sensor is provided for sensing the frequency error of signals outputted from said first output terminal and said second output terminal; thereby the centre of intermediate frequency and the oscillation frequency of said second oscillator are made almost identical by controlling the data of frequency divider at an increasing/decreasing counter based on the output of error sensor.

25. The high frequency apparatus of claim 24, wherein the band width defined by 3 dB cut-off frequency of intermediate frequency tuning surface acoustic wave filter is made to be more than 0% within +5% of the band width identical to symbol rate of receiving signal.

26. The high frequency apparatus of claim 1 further comprising an input filter between the input terminal and the mixer, wherein the local oscillator oscillates a frequency so as to obtain an intermediate frequency that is greater than one half the difference between the largest frequency and the smallest frequency of signals inputted to said input terminal, said input filter being a fixed filter which allows a frequency range from said smallest frequency to the largest frequency to pass through.

27. The high frequency apparatus of claim 26, wherein the output signal frequency of mixer is approximately 612 MHz.

28. The high frequency apparatus of claim 1 further comprising an I/Q extracting means connected to the output terminal, a first output terminal connected to the I signal output of I/Q extracting means, a second output terminal connected to the Q signal output of said I/Q extracting means, and a demodulator connected to said first and second output terminals, the demodulator being disposed outside of metal cover.

29. The high frequency apparatus of claim 28, wherein a substrate on which surface the demodulator comprised of integrated circuits is mounted, a copper foil laid on the surface of said substrate in an area underneath said demodulator, and a copper foil provided on the back surface of said substrate are connected together by a through hole.

30. The high frequency apparatus of claim 28, wherein the substrate on which the demodulator comprised of integrated circuits is mounted is provided with a hole underneath said integrated circuits, the size of the hole being larger than chip size within the integrated circuits and smaller than the outer dimensions of integrated circuits.

31. The high frequency apparatus of claim 29, wherein a plurality of strip-shaped areas void of solder resist are provided on the copper foil of the back surface of substrate, and a solder is provided protruded in the strip-shaped areas void of solder resist.

32. The high frequency apparatus of claim 1, further comprising an input filter provided between the input terminal and the mixer, an intermediate frequency tuning filter connected to the output terminal, an I/Q extracting means to which the output of intermediate frequency tuning filter is connected, a first output terminal connected to the I signal output of I/Q extracting means, and a second output terminal connected to the Q signal output of said I/Q extracting means; wherein all of the above items are housed in one shield case.

33. The high frequency apparatus of claim 32, wherein at least one shield board is provided between the mixer and the oscillator of I/Q extracting means.

34. The high frequency apparatus of claim 32, wherein the mixer and the oscillator of I/Q extracting means are housed in one shield case, and disposed on a diagonal line.

35. The high frequency apparatus of claim 32, wherein the input terminal is disposed on one lengthwise side board of an approximately rectangular-shaped shield case, an input filter and said mixer are disposed after the input terminal, a separating plate is provided approximately in parallel with said input filter and said mixer, and a local oscillator for supplying oscillation frequency to said mixer is provided in the other side of said separating plate opposite to said input filter and said mixer.

36. The high frequency apparatus of claim 33, wherein a compartment for housing intermediate frequency tuning filter is provided between the local oscillator for supplying oscillation frequency to mixer and the I/Q extracting means.

37. The high frequency apparatus of claim 35, further comprising an output terminal of I/Q extracting means and a control terminal of the local oscillator disposed in the vicinity of the first widthwise side board of shield case.

38. A high frequency apparatus comprising an input terminal for inputting digital modulated high frequency signals, a mixer which receives at one input the signals inputted to input terminal and at the other input an output signal of local oscillator, and an output terminal to which the output signal of mixer is delivered;

said local oscillator being comprised of a voltage controlled oscillator, a phase comparator and a frequency divider and loop filter, the last three items disposed intervening in the control loop, said voltage controlled oscillator being comprised of an oscillating section and a tuning section, which tuning section being comprised of a frequency adjusting section and a means for maintaining a state of the frequency adjusting section after adjustment; wherein said control loop has a loop band width so that the noise of said local oscillator is not dominated by the noise of said voltage controlled oscillator, and signal level of the reference frequency signal supplied to said phase comparator is made to be smaller, relative to comparative signal supplied from frequency divider to comparator, in a respective frequency excluding a portion substantially the centre of frequency.

39. The high frequency apparatus of claim 38, wherein the frequency adjusting section comprises a movable conductive member provided on substrate, a fix member is employed as the means for maintaining said movable conductive member fixed.

40. The high frequency apparatus of claim 38, wherein a pattern inductance line is employed as the inductance element of tuning section, a movable conductive member is disposed at the vicinity of pattern inductance line, an adjustment is conducted using the movable conductive member, and the movable conductive member is fixed, after adjusted, with a fix member employed as the maintaining means.

41. The high frequency apparatus of claim 40, wherein a movable conductive member is disposed approximately in parallel with the pattern inductance line above the width centre of the pattern inductance line.

42. The high frequency apparatus of claim 40, wherein the movable conductive member is disposed in the vicinity of an open end of the pattern inductance line.

43. The high frequency apparatus of claim 38, wherein a coreless coil or a flat type transmission line is provided as the inductance element of tuning section, the coreless coil or the flat type transmission line is adjusted, and then said coreless coil or flat type transmission line is fixed with a fix member employed as the maintaining means.

44. The high frequency apparatus of claim 38, wherein the frequency adjusting section is comprised of outer surface of a core employed as the maintaining means and a conductor wound around said core.

45. The high frequency apparatus of claim 38, wherein an inductance element of the tuning section is comprised of a cylindrical insulator, a conductor wound around the outer surface of said cylindrical insulator, a female screw provided in the inner wall surface of said cylindrical insulator and a movable core the outer surface of which is provided with a male screw matching the female screw.

46. The high frequency apparatus of claim 38, wherein an inductance element of the tuning section is formed by a pattern inductance line and a movable conductive member connected together in series at each respective end, said movable conductive member is adjusted, a fix member is employed as the maintaining means, and said movable conductive member is fixed by said fix member.

47. The high frequency apparatus of claim 38, wherein a pattern inductance line is used as the inductance element of tuning section, an adjusting portion of the pattern inductance line undergoes trimming for adjustment, and the trimmed part is covered with a covering material.

48. The high frequency apparatus of claim 47, wherein the pattern inductance line and a movable conductive member are connected together in series at each respective end, the movable conductive member is adjusted, a fix member is employed as the maintaining means, and said movable conductive member is fixed by said fix member.

49. The high frequency apparatus of claim 38, wherein the local oscillator and the mixer are housed respectively in metal case, and a pattern inductance line laid on substrate as a part of the tuning section of said local oscillator is provided in the vicinity of said case or a metal separating plate.

50. The high frequency apparatus of claim 38, wherein a film capacitor is used as the capacitance of loop filter.

51. The high frequency apparatus of claim 50, wherein the film capacitor is mounted on the surface of substrate, a lead wire of said film capacitor being inserted in a through hole provided in said substrate, said lead wire is soldered to a conductive pattern in the back surface of substrate, while there is no electrode formed inside said through hole.

52. The high frequency apparatus of claim 50, wherein the loop filter and the local oscillator are separated to each other by a separating plate, the separation plate being provided with an opening for allowing a conductive pattern connecting said loop filter and said local oscillator to go through, and said film capacitor is mounted in the vicinity of the opening in a manner to cover the opening.

53. The high frequency apparatus of claim 38, wherein the loop filter is comprised of two stage transistors.

54. The high frequency apparatus of claim 38, wherein a movable conductive member is provided in the tuning section, said movable conductive member, a varactor diode and a pattern inductance line are connected together in series in the order, and said pattern inductance line is connected to the oscillating section.

55. The high frequency apparatus of claim 38, wherein the tuning section is comprised of a varactor diode and a pattern inductance line, said varactor diode and pattern inductance line being connected in series with a small capacitance chip capacitor in between, and said small capacitance chip capacitor is mounted in the vicinity of said pattern inductance line.

56. The high frequency apparatus of claim 55, wherein a small capacitance chip capacitor is provided as a first capacitor between the varactor diode and the inductance, and a second capacitor is provided between said varactor diode and the oscillating section, said first capacitor and said second capacitor being temperature compensation capacitors.

57. The high frequency apparatus of claim 38 further comprising a reference frequency divider in connection to the phase comparator, to which phase comparator a reference frequency signal is inputted, the dividing ratio of reference frequency divider being variable.

58. The high frequency apparatus of claim 57, wherein the dividing ratio of reference frequency divider is made to go smaller along with the increasing output frequency of voltage controlled oscillator.

59. The high frequency apparatus of claim 38 further comprising a plurality of parallel-connected intermediate frequency tuning filters each having roll-off characteristic and different band width, wherein one of the intermediate frequency tuning filters is selectively switched based on the transmission rate of signal inputted to the input terminal.

60. The high frequency apparatus of claim 38 further comprising a variable attenuator between the input terminal and the mixer, and a control terminal for controlling the variable attenuator.

61. The high frequency apparatus of claim 38 further comprising an I/Q detector connected to the output terminal via an intermediate frequency tuning surface acoustic wave filter, a first output terminal to which the I signal of I/Q detector is delivered, a second output terminal to which the Q signal of said I/Q detector is delivered, and a second oscillator for supplying oscillation frequency signal to said I/Q detector; wherein said second oscillator comprises resonating section, the substrate of surface acoustic wave resonator of said resonating section and the substrate of said intermediate frequency tuning surface acoustic wave filter being made of a same material, and a frequency error sensor is provided for sensing the frequency error of signals outputted from said first output terminal and said second output terminal; thereby the centre of intermediate frequency and the oscillation frequency of said second oscillator are made almost identical by controlling the data of frequency divider at an increasing/decreasing counter based on the output of error sensor.

62. The high frequency apparatus of claim 61, wherein the band width defined by 3 dB cut-off frequency of intermediate frequency tuning surface acoustic wave filter is made to be more than 0% within +5% of the band width identical to symbol rate of receiving signal.

63. The high frequency apparatus of claim 38 further comprising an input filter between the input terminal and the mixer, wherein the local oscillator oscillates a frequency so as to obtain an intermediate frequency greater than one half the difference between the largest frequency and the smallest frequency of signals inputted to said input terminal, said input filter being a fixed filter which allows a frequency range from said smallest frequency to the largest frequency to pass through.

64. The high frequency apparatus of claim 63, wherein the output signal frequency of mixer is approximately 612 MHz.

65. The high frequency apparatus of claim 38 further comprising an I/Q extracting means connected to the output terminal, a first output terminal connected to the I signal output of I/Q extracting means, a second output terminal connected to the Q signal output of said I/Q extracting means, and a demodulator connected to said first and second output terminals, the demodulator being disposed outside of metal cover.

66. The high frequency apparatus of claim 65, wherein a substrate having the demodulator comprised of integrated circuits mounted on the surface, a copper foil laid on the surface of said substrate in an area underneath said demodulator, and a copper foil provided on the back surface of said substrate are connected together by a through hole.

67. The high frequency apparatus of claim 65, wherein the substrate having the demodulator comprised of integrated circuits mounted on the surface is provided with a hole underneath said integrated circuits, the size of the hole being larger than chip size within the integrated circuits and smaller than the outer dimensions of integrated circuits.

68. The high frequency apparatus of claim 66, wherein a plurality of strip-shaped areas void of solder resist are provided on the copper foil of the back surface of substrate, and a solder is provided protruded in the strip-shaped areas void of solder resist.

69. The high frequency apparatus of claim 38, further comprising an input filter provided between the input terminal and the mixer, an intermediate frequency tuning filter connected to the output terminal, an I/Q extracting means to which the output of intermediate frequency tuning filter is connected, a first output terminal connected to the I signal output of I/Q extracting means, and a second output terminal connected to the Q signal output of said I/Q extracting means; wherein all of the above items are housed in one shield case.

70. The high frequency apparatus of claim 69, wherein at least one shield board is provided between the mixer and the oscillator of I/Q extracting means.

71. The high frequency apparatus of claim 69, wherein the mixer and the oscillator of I/Q extracting means are housed in one shield case, and disposed on a diagonal line.

72. The high frequency apparatus of claim 69, wherein the input terminal is disposed on one lengthwise side board of an approximately rectangular-shaped shield case, an input filter and said mixer are disposed next to the input terminal, a separating plate is provided approximately in parallel with said input filter and said mixer, and a local oscillator for supplying oscillation frequency to said mixer is disposed in the other side of said separating plate opposite to said input filter and said mixer.

73. The high frequency apparatus of claim 70, wherein a compartment for housing intermediate frequency tuning filter is provided between the local oscillator for supplying oscillation frequency to mixer and the I/Q extracting means.

74. The high frequency apparatus of claim 72, further comprising an output terminal of I/Q extracting means and a control terminal of the local oscillator disposed in the vicinity of the first widthwise side board of shield case.

75. A high frequency apparatus comprising an input terminal for inputting digital modulated high frequency signals, a mixer which receives at one input the signals inputted to input terminal and at the other input an output signal of local oscillator, and an output terminal to which the output signal of mixer is delivered;
said local oscillator being comprised of a voltage controlled oscillator, a phase comparator, a frequency divider and a loop filter, the last three items disposed intervening in the control loop, said voltage controlled oscillator being comprised of an oscillating section and a tuning section, which tuning section being comprised of a frequency adjusting section and a means for maintaining a state of the frequency adjusting section after adjustment; wherein
said control loop has a loop band width so that the noise of said local oscillator is not dominated by the noise of said voltage controlled oscillator, and signal level of the frequency distribution characteristic at the centre frequency of the reference frequency signal supplied to said phase comparator is made to be lower, relative to the signal level of frequency distribution characteristic in the vicinity of centre frequency outputted from said local oscillator to mixer, than a signal level to be noise-reduced by the high loop band width in a same off-set frequency from the respective centre frequency excluding a portion substantially the centre of frequency in the frequency distribution characteristic.

76. The high frequency apparatus of claim 75, wherein the frequency adjusting section comprises a movable conductive member provided on substrate, a fix member is employed as the means for maintaining said movable conductive member fixed.

77. The high frequency apparatus of claim 75, wherein a pattern inductance line is employed as the inductance element of tuning section, a movable conductive member is disposed at the vicinity of pattern inductance line, an adjustment is conducted using the movable conductive member, and the movable conductive member is fixed, after adjusted, with a fix member employed as the maintaining means.

78. The high frequency apparatus of claim 77, wherein the movable conductive member is disposed approximately in parallel with the pattern inductance line above the width centre of the pattern inductance line.

79. The high frequency apparatus of claim 77, wherein the movable conductive member is disposed in the vicinity of an open end of the pattern inductance line.

80. The high frequency apparatus of claim 75, wherein a coreless coil or a flat type transmission line is provided as the inductance element of tuning section, the coreless coil or the flat type transmission line is adjusted, and then said coreless coil or flat type transmission line is fixed with a fix member employed as the maintaining means.

81. The high frequency apparatus of claim 75, wherein the frequency adjusting section is comprised of outer surface of a core employed as the maintaining means and a conductor wound around said core.

82. The high frequency apparatus of claim 75, wherein an inductance element of the tuning section is comprised of a cylindrical insulator, a conductor wound around the outer surface of said cylindrical insulator, a female screw provided in the inner wall surface of said cylindrical insulator and a movable core the outer surface of which is provided with a male screw matching the female screw.

83. The high frequency apparatus of claim 75, wherein an inductance element of the tuning section is formed by a pattern inductance line and a movable conductive member connected together in series at each respective end, said movable conductive member is adjusted, a fix member is employed as the maintaining means, and said movable conductive member is fixed by said fix member.

84. The high frequency apparatus of claim 75, wherein a pattern inductance line is used as the inductance element of tuning section, an adjusting portion of the pattern inductance line undergoes trimming for adjustment, and the trimmed part is covered with a covering material.

85. The high frequency apparatus of claim 84, wherein the pattern inductance line and a movable conductive member are connected together in series at each respective end, the movable conductive member is adjusted, a fix member is employed as the maintaining means, and said movable conductive member is fixed by said fix member.

86. The high frequency apparatus of claim 75, wherein the local oscillator and the mixer are housed respectively in metal case, and a pattern inductance line laid on substrate as a part of the tuning section of said local oscillator is provided in the vicinity of said case or a metal separating plate.

87. The high frequency apparatus of claim 75, wherein a film capacitor is used as the capacitance of loop filter.

88. The high frequency apparatus of claim 87, wherein the film capacitor is mounted on the surface of substrate, a lead wire of said film capacitor being inserted in a through hole provided in said substrate, said lead wire is soldered to a conductive pattern in the back surface of substrate, while there is no electrode formed inside said through hole.

89. The high frequency apparatus of claim 75, wherein the loop filter and the local oscillator are separated to each other by a separating plate, the separating plate being provided with an opening for allowing a conductive pattern connecting said loop filter and said local oscillator to go through, and said film capacitor is mounted in the vicinity of the opening in a manner to cover the opening.

90. The high frequency apparatus of claim 75, wherein the loop filter is comprised of two stage transistors.

91. The high frequency apparatus of claim 75, wherein a movable conductive member is provided in the tuning section, said movable conductive member, a varactor diode and a pattern inductance line are connected together in series in the order, and said pattern inductance line is connected to the oscillating section.

92. The high frequency apparatus of claim 75, wherein the tuning section is comprised of a varactor diode and a pattern inductance line, said varactor diode and pattern inductance line being connected in series with a small capacitance chip capacitor in between, and said small capacitance chip capacitor is mounted in the vicinity of said pattern inductance line.

93. The high frequency apparatus of claim 92, wherein a small capacitance chip capacitor is provided as a first capacitor between the varactor diode and the inductance, and a second capacitor is provided between said varactor diode and the oscillating section, said first capacitor and said second capacitor being temperature compensation capacitors.

94. The high frequency apparatus of claim 75 further comprising a reference frequency divider in connection to the phase comparator, to which phase comparator a reference frequency signal is inputted, the dividing ratio of the reference frequency divider being variable.

95. The high frequency apparatus of claim 94, wherein the dividing ratio of reference frequency divider is made to go smaller along with the increasing output frequency of voltage controlled oscillator.

96. The high frequency apparatus of claim 75 further comprising a plurality of parallel-connected intermediate frequency tuning filters each having roll-off characteristic and different band width, wherein one of the intermediate frequency tuning filters is selectively switched based on the transmission rate of the signal inputted to input terminal.

97. The high frequency apparatus of claim 75 further comprising a variable attenuator between the input terminal and the mixer, and a control terminal for controlling the variable attenuator.

98. The high frequency apparatus of claim 75 further comprising an I/Q detector connected to the output terminal via an intermediate frequency tuning surface acoustic wave filter, a first output terminal to which the I signal of I/Q detector is delivered, a second output terminal to which the Q signal of said I/Q detector is delivered, and a second oscillator for supplying oscillation frequency signal to said I/Q detector; wherein said second oscillator comprises resonating section, the substrate of surface acoustic wave resonator of said resonating section and the substrate of said intermediate frequency tuning surface acoustic wave filter being made of a same material, and a frequency error sensor is provided for sensing the frequency error of signals outputted from said first output terminal and said second output terminal; thereby the centre of intermediate frequency and the oscillation frequency of said second oscillator are made almost identical by controlling the data of frequency divider at an increasing/decreasing counter based on the output of error sensor.

99. The high frequency apparatus of claim 98, wherein the band width defined by 3 dB cut-off frequency of intermediate frequency tuning surface acoustic wave filter is made to be more than 0% within +5% of the band width identical to symbol rate of receiving signal.

100. The high frequency apparatus of claim 75 further comprising an input filter between the input terminal and the mixer, wherein the local oscillator oscillates a frequency so as to obtain an intermediate frequency that is greater than one half the difference between the largest frequency and the smallest frequency of signals inputted to said input terminal, said input filter being a fixed filter which allows a frequency range from said smallest frequency to the largest frequency to pass through.

101. The high frequency apparatus of claim 100, wherein the output signal frequency of mixer is approximately 612 MHz.

102. The high frequency apparatus of claim 75 further comprising an I/Q extracting means connected to the output terminal, a first output terminal connected to the I signal output of I/Q extracting means, a second output terminal connected to the Q signal output of said I/Q extracting means, and a demodulator connected to said first and second output terminals, the demodulator being disposed outside of metal cover.

103. The high frequency apparatus of claim 102, wherein a substrate having the demodulator comprised of integrated circuits mounted on the surface, a copper foil laid on the surface of said substrate in an area underneath said demodulator, and a copper foil provided on the back surface of said substrate are connected together by a through hole.

104. The high frequency apparatus of claim 102, wherein the substrate having the demodulator comprised of integrated circuits mounted on the surface is provided with a hole underneath said integrated circuits, the size of the hole being larger than chip size within the integrated circuits and smaller than the outer dimensions of integrated circuits.

105. The high frequency apparatus of claim 103, wherein a plurality of strip-shaped areas void of solder resist are provided on the copper foil of the back surface of substrate, and a solder is provided protruded in the strip-shaped areas void of solder resist.

106. The high frequency apparatus of claim 75, further comprising an input filter provided between the input terminal and the mixer, an intermediate frequency tuning filter connected to the output terminal, an I/Q extracting means to which the output of intermediate frequency tuning filter is connected, a first output terminal connected to the I signal output of I/Q extracting means, and a second output terminal connected to the Q signal output of said I/Q extracting means; wherein all of the above items are housed in one shield case.

107. The high frequency apparatus of claim 106, wherein at least one shield board is provided between the mixer and the oscillator of I/Q extracting means.

108. The high frequency apparatus of claim 106, wherein the mixer and the oscillator of I/Q extracting means are housed in one shield case, and disposed on a diagonal line.

109. The high frequency apparatus of claim 106, wherein the input terminal is disposed on one lengthwise side board of an approximately rectangular-shaped shield case, an input filter and said mixer are disposed next to the input terminal, a separating plate is provided approximately in parallel with said input filter and said mixer, and a local oscillator for supplying oscillation frequency to said mixer is disposed in the other side of said separating plate opposit to said input filter and said mixer.

110. The high frequency apparatus of claim 107, wherein a compartment for housing intermediate frequency tuning filter is provided between the local oscillator for supplying oscillation frequency to mixer and the I/Q extracting means.

111. The high frequency apparatus of claim 109, further comprising an output terminal of I/Q extracting means and a control terminal of the local oscillator disposed in the vicinity of the first widthwise side board of shield case.

* * * * *